(12) United States Patent
Kim et al.

(10) Patent No.: US 8,512,596 B2
(45) Date of Patent: Aug. 20, 2013

(54) COMPOSITION FOR PRODUCING A BOARD AND PRINTED CIRCUIT BOARD USING THE SAME

(75) Inventors: Kwang Hee Kim, Seoul (KR); Myung Sup Jung, Seongnam-si (KR); Chung Kun Cho, Suwon-si (KR); Jae Jun Lee, Suwon-si (KR); Kalinina Fedosya, Yongin-si (KR)

(73) Assignees: Samsung Electronics Co., Ltd. (KR); Samsung Electro-Mechanics Co., Ltd. (KR); Samsung Fine Chemicals Co., Ltd. (KR)

( * ) Notice: Subject to any disclaimer, the term of this patent is extended or adjusted under 35 U.S.C. 154(b) by 680 days.

(21) Appl. No.: 12/633,127

(22) Filed: Dec. 8, 2009

(65) Prior Publication Data

US 2010/0139961 A1 Jun. 10, 2010

(30) Foreign Application Priority Data

Dec. 8, 2008 (KR) .................. 10-2008-0124102
Dec. 4, 2009 (KR) .................. 10-2009-0119885

(51) Int. Cl.
*C09K 19/00* (2006.01)
*C09K 19/06* (2006.01)
*C09K 19/34* (2006.01)
*C09K 19/52* (2006.01)
*H05K 1/00* (2006.01)

(52) U.S. Cl.
USPC .............. 252/299.01; 252/299.6; 252/299.62; 252/299.63; 252/299.65; 428/1.1; 428/1.3; 174/258; 174/260; 525/403; 525/408; 525/432; 257/777; 427/97.1

(58) Field of Classification Search
USPC .............. 252/299.01, 299.6, 299.62, 299.63, 252/299.65; 428/1.1, 1.3; 174/258, 260; 525/403, 408, 432
See application file for complete search history.

(56) References Cited

U.S. PATENT DOCUMENTS 5,575,949 A 11/1996 Benicewicz et al.
2010/0124037 A1* 5/2010 Jung et al. .................. 252/299.61

FOREIGN PATENT DOCUMENTS

JP 2006348298 12/2006

* cited by examiner

Primary Examiner — Geraldina Visconti
(74) Attorney, Agent, or Firm — Cantor Colburn LLP

(57) ABSTRACT

A composition, including a liquid crystal polymer or oligomer having a terminal hydroxyl group, and a cross-linking agent including a bismaleimide compound, an epoxy resin or a combination thereof, wherein the liquid crystal polymer or oligomer is represented by Formula 1:

$$Z^1-(R^1)_m-(R^2)_n-Z^2 \qquad (1),$$

wherein $R^1$ is represented by Formula 2:

$$-X^1-Ar^1-Y^1- \qquad (2),$$

wherein $X^1$ and $Y^1$ are each independently selected from the group consisting of O, CO and NR", in which R" is independently selected from the group consisting of a hydrogen atom, a substituted or unsubstituted $C_1$-$C_{20}$ alkyl group, and a substituted or unsubstituted $C_6$-$C_{30}$ aryl group, and $Ar^1$ includes at least one divalent aromatic or alicyclic organic group selected from the group consisting of Formula 3:

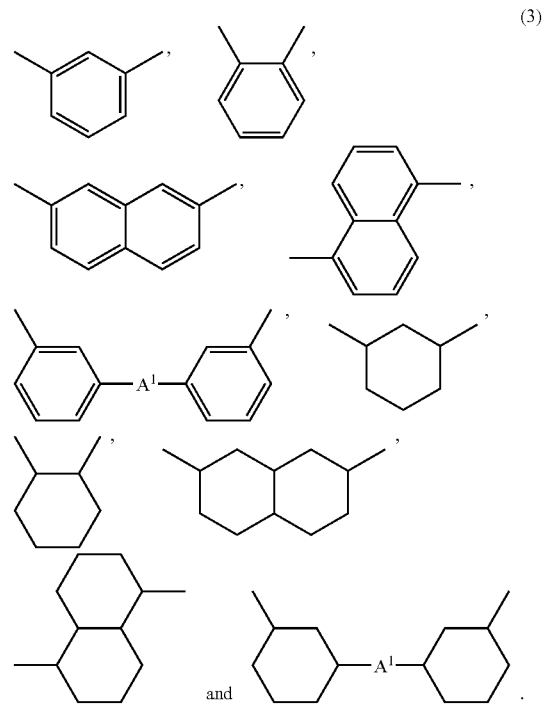

(3)

22 Claims, 1 Drawing Sheet

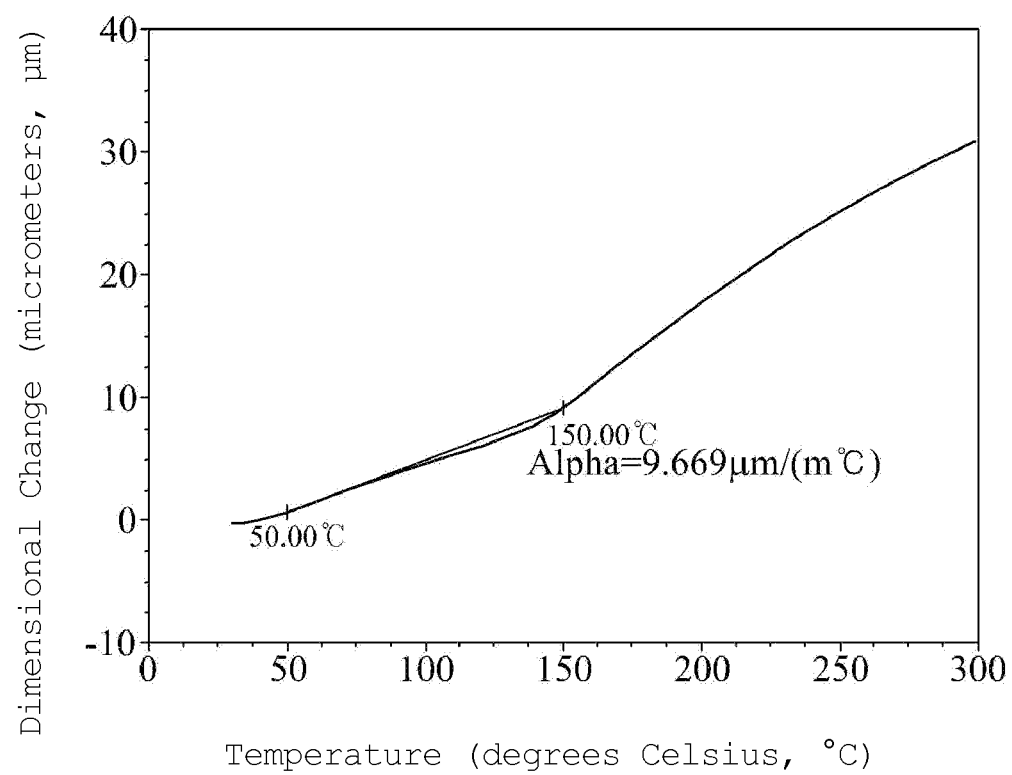

COMPOSITION FOR PRODUCING A BOARD AND PRINTED CIRCUIT BOARD USING THE SAME

CROSS-REFERENCE TO RELATED APPLICATION

This application claims priority to Korean Patent Application No. 10-2008-124102, filed on Dec. 8, 2008, and Korean Patent Application No. 10-2009-0119885, filed on Dec. 4, 2009, and all the benefits accruing therefrom under 35 U.S.C. §119, the contents of which in their entirety are herein incorporated by reference.

BACKGROUND

1. Field

The present disclosure is directed to a composition for producing a board and a printed circuit board produced using the composition.

2. Description of the Related Art

Recent advances in information and communication technologies have transformed our society into a high-tech communication and information society based on a convergence of computers and communication devices. The trend toward miniaturization and high performance electronic devices, such as mobile phones and personal computers, has led to high-density integration of printed circuit boards as elements of electronic devices. Such high-density integration is achieved by layering printed circuit boards, reducing the thickness of printed circuit boards and reducing a diameter and an interval of through-holes, for example. Accordingly, an improved board material with higher performance is desirable.

The use of high operating frequencies for rapid processing of data in electronic information devices, such as computers, can be hampered by phenomena such as transmission loss and signal delay. Generally, a signal delay in a printed circuit board increases linearly in proportion to the square root of the relative permittivity of an insulating material around interconnection lines. Thus, low-permittivity polymer resin compositions are desirable to produce boards, which can support a high transmission rate. It would also be desirable to develop an improved board material, which exhibits excellent heat resistance, improved impregnation properties and thermal curability in the production of films or prepregs.

SUMMARY

Disclosed herein is a composition, including: a liquid crystal polymer or oligomer having a terminal hydroxyl group; and a cross-linking agent including a bismaleimide compound, an epoxy resin or a combination thereof, wherein the liquid crystal polymer or oligomer is represented by Formula 1:

$$Z^1-(R^1)_m-(R^2)_n-Z^2 \quad (1),$$

wherein $R^1$ is represented by Formula 2:

$$-X^1-Ar^1-Y^1- \quad (2),$$

wherein $X^1$ and $Y^1$ are each independently selected from the group consisting of O, CO and NR'', in which R'' is independently selected from the group consisting of a hydrogen atom, a substituted or unsubstituted $C_1$-$C_{20}$ alkyl group and a substituted or unsubstituted $C_6$-$C_{30}$ aryl group, and $Ar^1$ includes at least one divalent aromatic or alicyclic organic group selected from the group consisting of Formula 3:

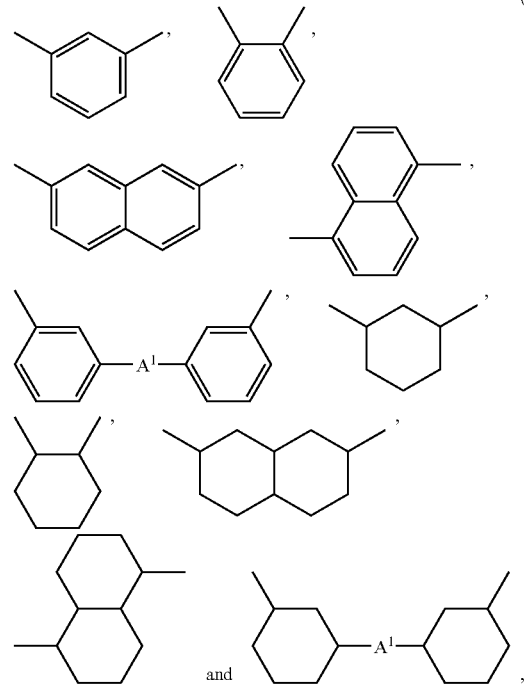

(3)

and 

wherein at least one of the carbon atoms present in each of the aromatic and aliphatic rings is optionally replaced with a heteroatom independently selected from the group consisting of N, O, S and P, and each $A^1$ represents a single bond or is O, S, CO, SO, $SO_2$ or a divalent aliphatic or aromatic organic group, $R^2$ is represented by Formula 6:

$$X^2-Ar^3-Y^2 \quad (6),$$

wherein $X^2$ and $Y^2$ are each independently selected from the group consisting of O, CO and NR'', and $Ar^3$ includes at least one divalent aromatic or alicyclic organic group selected from the group consisting of Formula 7:

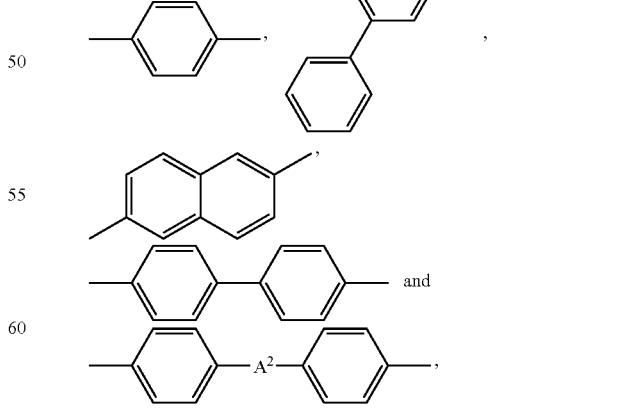

wherein $A^2$ is $N_2$, O, S, CO, SO, $SO_2$ or a divalent aliphatic or aromatic organic group, $Z^1$ and $Z^2$ are the same or different and are each independently an organic group including a hydroxyl, amine, carboxylic acid, acetyl or thiol group, with the proviso that at least one of $Z^1$ and $Z^2$ has a hydroxyl group, and m and n are each independently an integer from about 1 to about 100.

Also disclosed is a resin cured product, including: a polymer derived from a liquid crystal polymer or oligomer and a cross-linking agent including a bismaleimide compound, an epoxy resin or a combination thereof, wherein the liquid crystal polymer or oligomer is represented by Formula 1:

$$Z^1-(R^1)_m-(R^2)_n-Z^2 \qquad (1)$$

wherein $R^1$ is represented by Formula 2:

$$-X^1-Ar^1-Y^1- \qquad (2),$$

wherein $X^1$ and $Y^1$ are each independently selected from the group consisting of O, CO and NR", in which R" is selected from the group consisting of a hydrogen atom, a substituted or unsubstituted $C_1$-$C_{20}$ alkyl group, and a substituted or unsubstituted $C_6$-$C_{30}$ aryl group, and $Ar^1$ includes at least one divalent aromatic or alicyclic organic group selected from the group consisting of Formula 3:

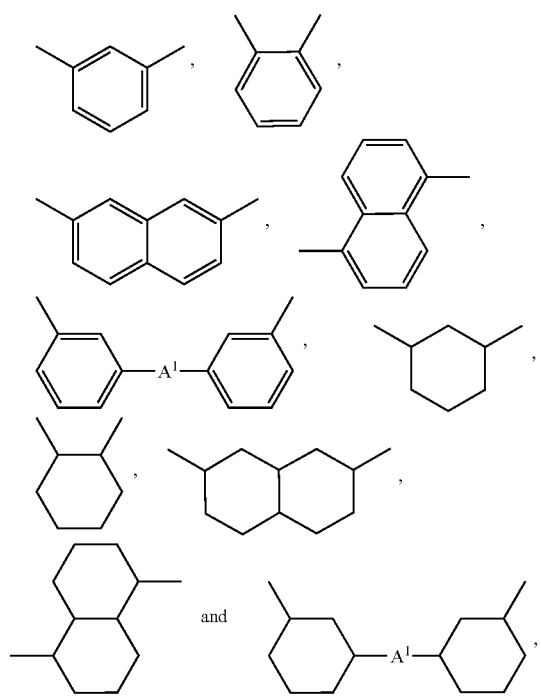

(3)

wherein at least one of the carbon atoms present in each of the aromatic and aliphatic rings is optionally replaced with a heteroatom independently selected from the group consisting of N, O, S and P, and each $A^1$ represents a single bond or is O, S, CO, SO, $SO_2$ or a divalent aliphatic or aromatic organic group, $R^2$ is represented by Formula 6:

$$-X^2-Ar^3-Y^2- \qquad (6),$$

wherein $X^2$ and $Y^2$ are each independently selected from the group consisting of O, CO and NR", and $Ar^3$ includes at least one divalent aromatic or alicyclic organic group selected from the group consisting of Formula 7:

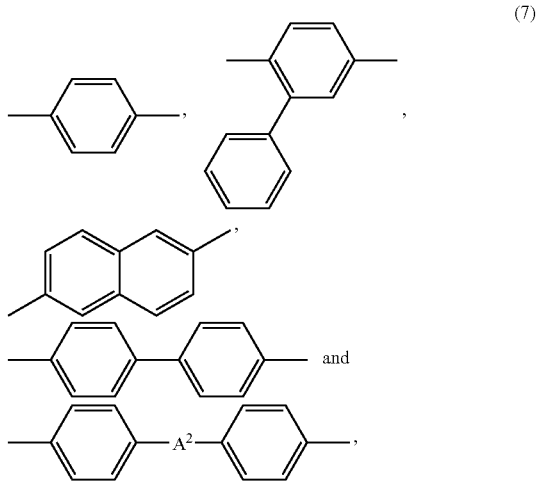

(7)

wherein $A^2$ is $N_2$, O, S, CO, SO, $SO_2$ or a divalent aliphatic or aromatic organic group, $Z^1$ and $Z^2$ are the same or different and are each independently an organic group including a hydroxyl, amine, carboxylic acid, acetyl or thiol group, with the proviso that at least one of $Z^1$ and $Z^2$ has a hydroxyl group, and m and n are each independently an integer from about 1 to about 100.

Also disclosed is a method for producing a prepreg, the method including: impregnating the composition into a reinforcing material to form a coated reinforcing material; drying the coated reinforcing material; and curing the coated reinforcing material.

Also disclosed herein is a composition for producing a board, the composition including a liquid crystal polymer or oligomer having one or two hydroxyl groups at one or both ends of the backbone and either a bismaleimide cross-linking agent or an epoxy resin or both.

Also disclosed herein is an article including the composition.

In an exemplary embodiment, the article may be a film or a prepreg.

Also disclosed herein is a printed circuit board including the prepreg.

BRIEF DESCRIPTION OF THE DRAWINGS

The exemplary embodiments will be more clearly understood from the following detailed description taken in conjunction with the accompanying drawing, in which:

FIG. 1 is a thermomechanical analysis ("TMA") curve illustrating dimensional change (micrometers, μm) versus temperature (degrees Celsius, ° C.) of an exemplary embodiment of a prepreg according to Example 2.

DETAILED DESCRIPTION

Exemplary embodiments are further described hereinafter with reference to the accompanying drawing, in which embodiments of the invention are shown. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. As used herein, the term "and/or" includes any and all combinations of one or more of the associated listed items.

It will be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the embodiments of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" can therefore encompass both an orientation of "lower" and "upper," depending on the particular orientation of the FIGURE. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "substituted" as used herein, unless otherwise specified, refers to a compound or radical substituted with one or more groups selected from the group consisting of halogen atoms, $C_1$-$C_{20}$ alkyl groups, $C_1$-$C_{20}$ alkoxy groups, $C_6$-$C_{30}$ aryl groups and $C_6$-$C_{30}$ aryloxy groups, provided that the substituted atom's normal valence is not exceeded.

Unless otherwise specified, the groups "alkyl", "alkenyl", "alkynyl", "alkylene", "alkenylene", "alkynylene", "cycloalkylene", "cycloalkenylene", "cycloalkynylene", "alkoxy" and "alkoxylene" as used herein represent $C_1$-$C_{20}$ alkyl, $C_2$-$C_{20}$ alkenyl, $C_2$-$C_{20}$ alkynyl, $C_2$-$C_{20}$ alkylene, $C_2$-$C_{20}$ alkenylene, $C_2$-$C_{20}$ alkynylene, $C_3$-$C_{20}$ cycloalkylene, $C_3$-$C_{20}$ cycloalkenylene, $C_3$-$C_{20}$ cycloalkynylene, $C_1$-$C_{20}$ alkoxy and $C_2$-$C_{20}$ alkoxylene, respectively. The groups "aryl", "arylene", "aryloxy" and "oxyarylene" represent $C_6$-$C_{30}$ aryl, $C_6$-$C_{30}$ arylene, $C_6$-$C_{30}$ aryloxy and $C_6$-$C_{30}$ oxyarylene, respectively.

Unless otherwise specified, the groups "heteroarylene" and "oxyheteroarylene" as used herein refer to arylene and oxyarylene groups in which at least one of the CH moieties present in the arylene ring is independently replaced by a heteroatom selected from the group consisting of N, O, S and P, respectively. The groups "heterocycloalkylene", "heterocycloalkenylene" and "heterocycloalkynylene" refer to cycloalkylene, cycloalkenylene and cycloalkynylene groups in which at least one of the $CH_2$, CH and C moieties present in the cycloalkylene, cycloalkenylene and cycloalkynylene rings is independently replaced by a heteroatom selected from the group consisting of N, O, S and P, respectively.

According to an exemplary embodiment, disclosed is a composition for producing a board, which includes a liquid crystal polymer or oligomer having a terminal hydroxyl group and a cross-linking agent comprising a bismaleimide compound, an epoxy resin, or the like or a combination thereof. In an embodiment, the composition may include a liquid crystal polymer or oligomer having one or two hydroxyl groups at one or both ends of the polymer backbone and a bismaleimide cross-linking agent. Alternatively, the composition may include a liquid crystal polymer or oligomer having one or two hydroxyl groups at one or both ends of the polymer backbone and an epoxy resin. Alternatively, the composition may include a liquid crystal polymer or oligomer having one or two hydroxyl groups at one or both ends of the polymer backbone, a bismaleimide cross-linking agent and an epoxy resin.

The liquid crystal polymer or oligomer may be highly soluble in a solvent due to the presence of the terminal hydroxyl groups therein, and while not wanting to be bound by theory it is understood that the hydroxyl groups contribute to an improvement in the solubility of the composition. The use of the composition with improved solubility enables the preparation of a varnish with a high solids content. The varnish can be used for the production of a prepreg or a copper clad laminate with improved impregnation properties, high heat resistance and improved mechanical properties.

The liquid crystal polymer or oligomer contains at least one aromatic or alicyclic structural unit with a kink structure and at least one mesogen structural unit in the backbone.

In an exemplary embodiment, the liquid crystal polymer or oligomer may be represented by Formula 1:

$$Z^1—(R^1)_n—(R^2)_n—Z^2 \qquad (1)$$

wherein $R^1$ is an aromatic or alicyclic structural unit having a kink structure, $R^2$ is a mesogen structural unit, $Z^1$ and $Z^2$, which may be the same or different, are each independently an organic group including a hydroxyl, amine, carboxylic acid, acetyl or thiol group, or the like, with the proviso that at least one of $Z^1$ and $Z^2$ has a hydroxyl group, and m and n are each independently an integer from about 1 to about 100, specifically about 2 to about 90, more specifically about 10 to about 80.

In an exemplary embodiment, the aromatic or alicyclic structural unit having a kink structure may be an aromatic or alicyclic group having two linking groups, which are in an ortho or a meta position relative to each other. The aromatic or alicyclic structural unit having a kink structure may be repetitively introduced into the backbone of the liquid crystal polymer or oligomer. The introduction of the kink structure reduces the linearity of the backbone of the liquid crystal polymer or oligomer. The reduced linearity deteriorates the interaction between the backbones of the adjacent liquid crystal polymers or oligomers and the crystallinity of the liquid crystal polymer or oligomer, resulting in improved solubility of the liquid crystal polymer or oligomer in a solvent.

In an exemplary embodiment, the aromatic or alicyclic structural unit $R^1$ having a kink structure may be represented by Formula 2:

$$—X^1—Ar^1—Y^1— \quad (2),$$

wherein $X^1$ and $Y^1$ are each independently selected from the group consisting of O, CO and NR" (in which R" is independently selected from the group consisting of a hydrogen atom, substituted or unsubstituted $C_1$-$C_{20}$ alkyl groups, and substituted or unsubstituted $C_6$-$C_{30}$ aryl groups), and $Ar^1$ includes at least one divalent aromatic or alicyclic organic group selected from the group consisting of Formula 3:

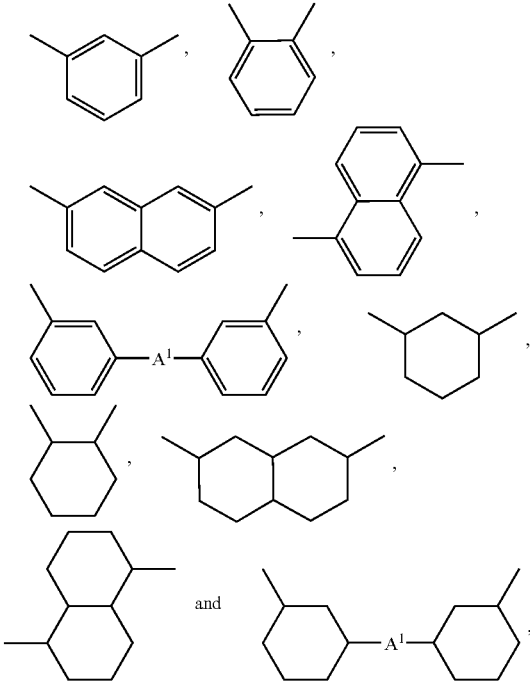

(3)

wherein at least one of the carbon atoms present in each of the aromatic and aliphatic rings is optionally replaced with a heteroatom independently selected from the group consisting of N, O, S and P, at least one of the hydrogen atoms present in each of the rings is substituted or unsubstituted, and each $A^1$ represents a single bond or is O, S, CO, SO, $SO_2$ or a divalent aliphatic or aromatic organic group.

In an exemplary embodiment, the divalent aliphatic or aromatic organic group may be selected from the group consisting of a substituted or unsubstituted $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, a substituted or unsubstituted $C_4$-$C_{30}$ oxyheteroarylene group, a linking group represented by Formula 3a:

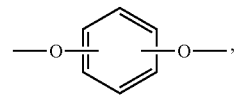

(3a)

and a linking group represented by Formula 3b:

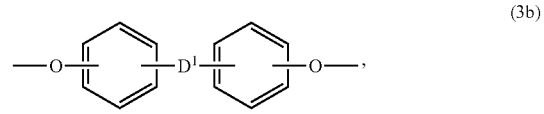

(3b)

wherein $D^1$ is independently selected from the group consisting of O, S, CO, SO, $SO_2$ and a straight or branched $C_1$-$C_{20}$ alkylene group.

In an exemplary embodiment, the aromatic or alicyclic structural unit $R^1$, which has a kink structure, may be selected from the group consisting of Formula 4:

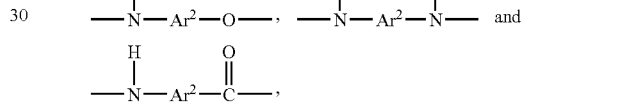

(4)

wherein each $Ar^2$ is selected from the group consisting of Formula 5:

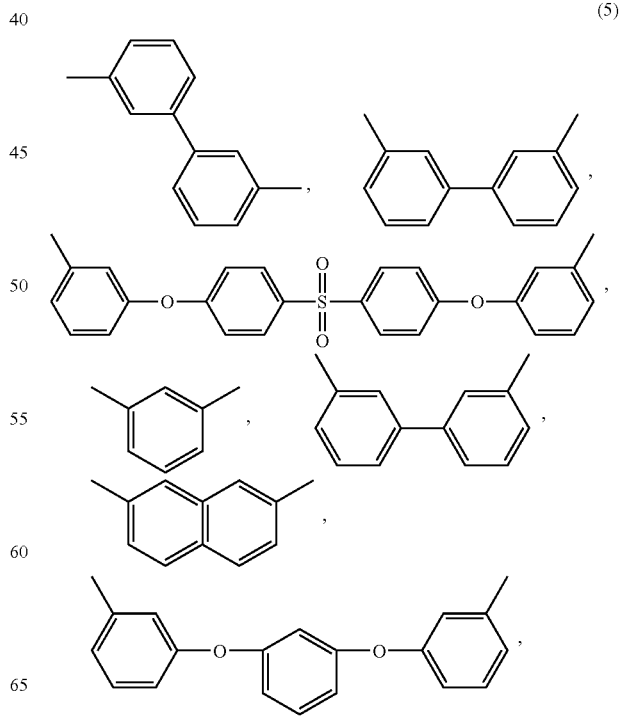

(5)

-continued

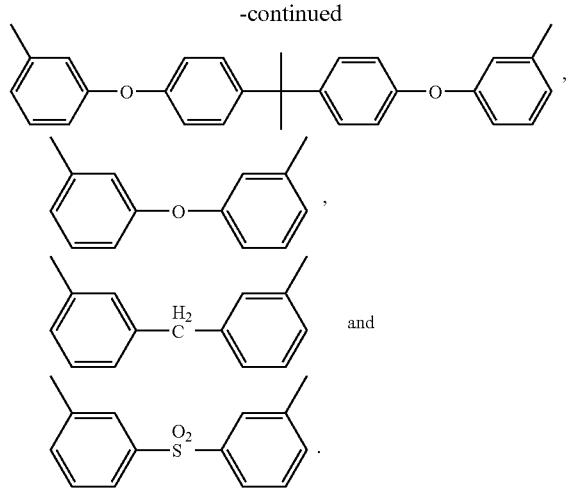

In an exemplary embodiment, the mesogen structural unit $R^2$ in Formula 1 may be represented by Formula 6:

$$-X^2-Ar^3-Y^2- \qquad (6),$$

wherein $X^2$ and $Y^2$ are each independently selected from the group consisting of O, CO and NR" (in which R" is selected from the group consisting of a hydrogen atom, substituted or unsubstituted $C_1$-$C_{20}$ alkyl groups, and substituted or unsubstituted $C_6$-$C_{30}$ aryl groups), and $Ar^a$ includes at least one divalent aromatic or alicyclic organic group selected from the group consisting of Formula 7:

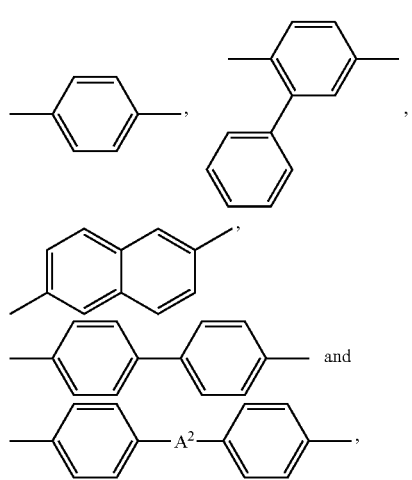

wherein at least one of the carbon atoms present in each of the aromatic and aliphatic rings is optionally replaced by a heteroatom independently selected from the group consisting of N, O, S and P, at least one of the hydrogen atoms present in each of the rings is substituted or unsubstituted, and $A^2$ is $N_2$, O, S, CO, SO, $SO_2$ or a divalent aliphatic or aromatic organic group.

In an exemplary embodiment, the divalent aliphatic or aromatic organic group in Formula 7 may be selected from the group consisting of a substituted or unsubstituted $C_2$-$C_{20}$ alkylene group, a substituted or unsubstituted $C_2$-$C_{20}$ alkenylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, a substituted or unsubstituted $C_4$-$C_{30}$ oxyheteroarylene group, a group of Formula 8a:

wherein $R_a$ is a hydrogen atom, a halogen atom, a $C_1$-$C_5$ alkyl group, or a $C_1$-$C_5$ haloalkyl group or the like, and the like, and a group of Formula 8b:

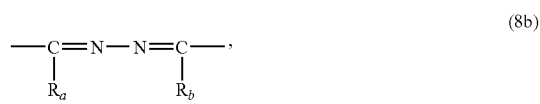

wherein $R_a$ and $R_b$ are each independently a hydrogen atom, a halogen atom, a $C_1$-$C_5$ alkyl group, or a $C_1$-$C_5$ haloalkyl group or the like.

In an exemplary embodiment, the mesogen structural unit may be selected from the group consisting of Formula 9:

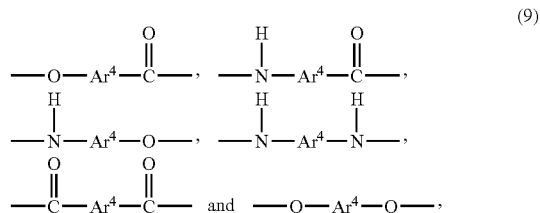

wherein each $Ar^4$ is independently selected from the group consisting of Formula 10:

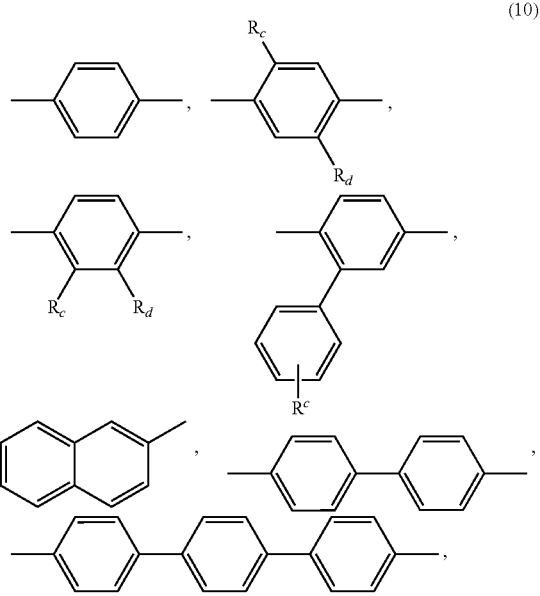

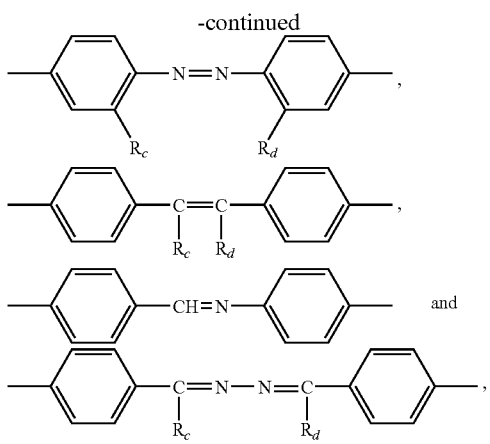

wherein $R_c$ and $R_d$ are each independently a proton, a $C_1$-$C_5$ alkyl group or a halogen group.

In an exemplary embodiment, the content of the aromatic or alicyclic structural unit having a kink structure in the liquid crystal polymer or oligomer is about 5 mole percent ("mole %") and about 60 mole %, specifically about 10 mole % and about 50 mole %, more specifically about 15 mole % and about 40 mole %, based on the total moles of all the structural units of the liquid crystal polymer or oligomer. In an embodiment, a quantity n/(n+m+2) in Formula 1 may be about 0.05 to about 0.6, specifically about 0.1 to about 0.5, more specifically about 0.3, and in an embodiment is greater than about 0.05 and less than or equal to about 0.6. The aromatic or alicyclic structural unit having a kink structure can be introduced into the backbone of the liquid crystal polymer or oligomer by using an aromatic or alicyclic compound having two functional groups in an ortho or a meta position relative to each other as a monomer in the preparation of the liquid crystal polymer or oligomer. The content of the aromatic or alicyclic structural unit having a kink structure can be controlled by varying the amount of the corresponding monomer added. The structure, content, etc. of the aromatic or alicyclic structural unit having a kink structure can be varied to control the characteristics (e.g., solubility and liquid crystallinity) of the liquid crystal polymer or oligomer.

In the liquid crystal polymer or oligomer of Formula 1, the structural units $R^1$ and $R^2$ can be arranged randomly, in blocks or alternately. Exemplary arrangements of $R^1$, $R^2$, $Z^1$ and $Z^2$ in Formula 1 include $Z^1R^1R^1R^1 \ldots R^2R^2R^2Z^2$, $Z^1R^1R^1R^2 \ldots R^1R^2R^2Z^2$, $Z^1R^1R^2R^2$, $R^2 \ldots R^1R^2Z^2$ or $Z^1R^1R^2R^1R^2 \ldots R^1R^2Z^2$.

In an exemplary embodiment, the liquid crystal polymer or oligomer of Formula 1, which may have a terminal hydroxyl group, and in an embodiment may have one or two terminal hydroxyl groups, may be represented by Formula 11a, 11b, 11c or 11d:

$$HO—(R^1)_m—(R^2)_n—CO—CH_3 \quad (11a),$$

wherein $R^1$ is represented by Formula 2, $R^2$ is represented by Formula 6, and m and n are each independently an integer, may be from about 1 to about 100, specifically about 2 to about 90, more specifically about 10 to about 80, and may satisfy the relationship $0.05<m/(n+m+2)\leq0.6$, specifically $0.1<m/(n+m+2)\leq0.5$, more specifically $0.1\leq m/(n+m+2)\leq 0.4$;

$$HO—(R^1)_m—(R^2)_n—OH \quad (11b),$$

wherein $R^1$, $R^2$, m and n are as defined in Formula 11a;

$$HO—(R^1)_m—(R^2)_n—COOH \quad (11c),$$

wherein $R^1$, $R^2$, m and n are as defined in Formula 11a; or $$HO—(R^1)_m—(R^2)_n—NH_2 \quad (11d),$$

wherein $R^1$, $R^2$, m and n are as defined in Formula 11a.

In an embodiment, the liquid crystal polymer or oligomer of Formula 1 is not limited to the compounds of Formulas 11a, 11b, 11c and 11d.

In an exemplary embodiment, the liquid crystal polymer or oligomer may include a compound represented by Formula 12:

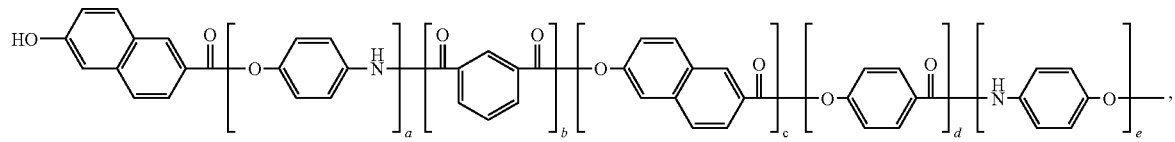

wherein a, c, d and e are each independently an integer from 0 to about 100, specifically about 2 to about 90, more specifically about 10 to about 80, and satisfy the relationship about $1 \leq a+c+d+e \leq$ about 100, specifically $2 \leq a+c+d+e \leq 99$, more specifically $10 \leq a+c+d+e \leq 90$ and b is an integer from of about 1 to about 100, specifically about 2 to about 90, more specifically about 10 to about 80.

In an exemplary embodiment, the liquid crystal polymer or oligomer having one or two terminal hydroxyl groups may include compounds represented by Formulas 13a-13e, 14a-14e, 15a-15e, 16a-16e and 17a-17e:

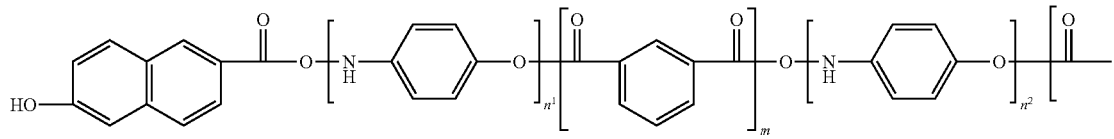

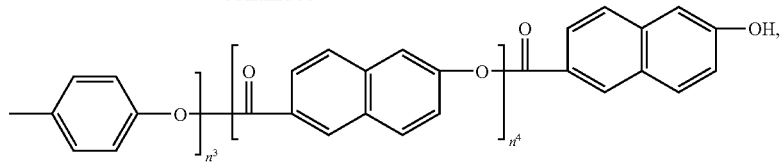

wherein m, $n^1$, $n^2$, $n^3$ and $n^4$ are each independently an integer from about 1 to about 100, specifically about 2 to about 90, more specifically about 10 to about 80, and $n^1$, $n^2$, $n^3$ and $n^4$ satisfy the relationship about $1 \leq n^1+n^2+n^3+n^4 \leq$ about 100, specifically about $2 \leq n^1+n^2\ n^3+n^4 \leq$ about 99, more specifically about $10 \leq n^1+n^2+n^3+n^4 \leq$ about 90;

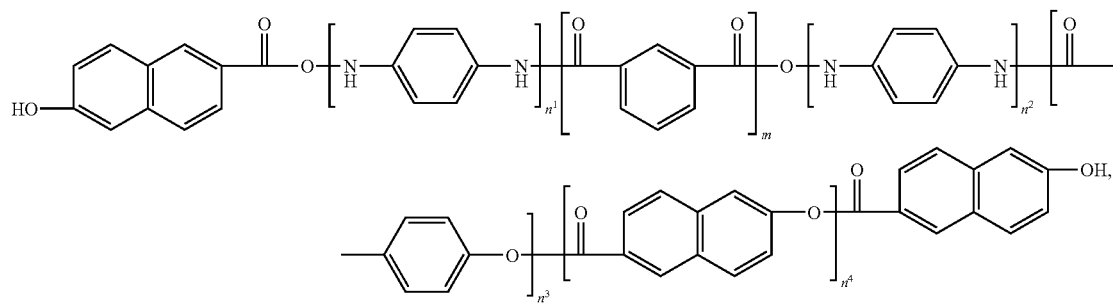

(13b)

wherein m, $n^1$, $n^2$, $n^3$ and $n^4$ are as defined in Formula 13a;

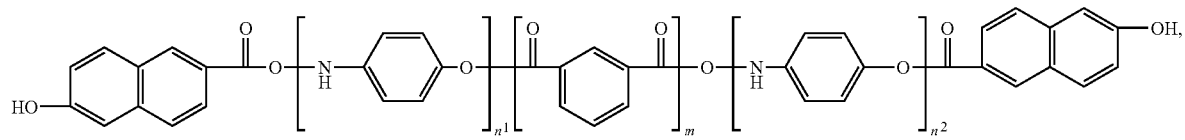

(13c)

wherein m, $n^1$ and $n^2$ are each independently an integer from about 1 to about 100, specifically about 2 to about 90, more specifically about 10 to about 80, and $n^1$ and $n^2$ satisfy the relationship about $1 \leq n^1+n^2 \leq$ about 100, about $2 \leq n^1+n^2$ about 99, about $10 \leq n^1+n^2 \leq$ about 90;

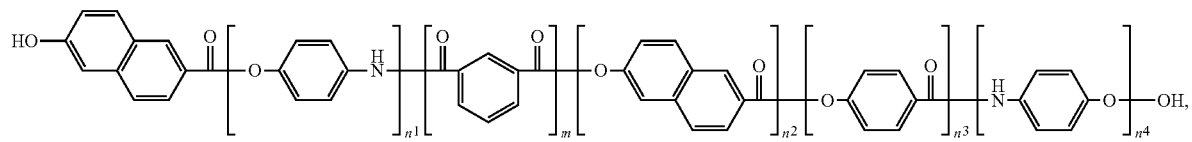

(13d)

wherein m, $n^1$, $n^2$, $n^3$ and $n^4$ are as defined in Formula 13a;
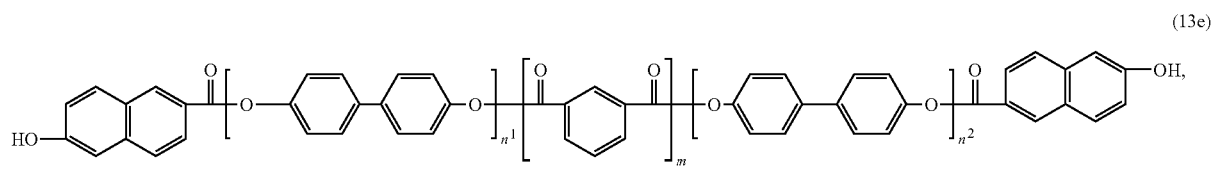
(13e)
wherein m, $n^1$ and $n^2$ are as defined in Formula 13c;
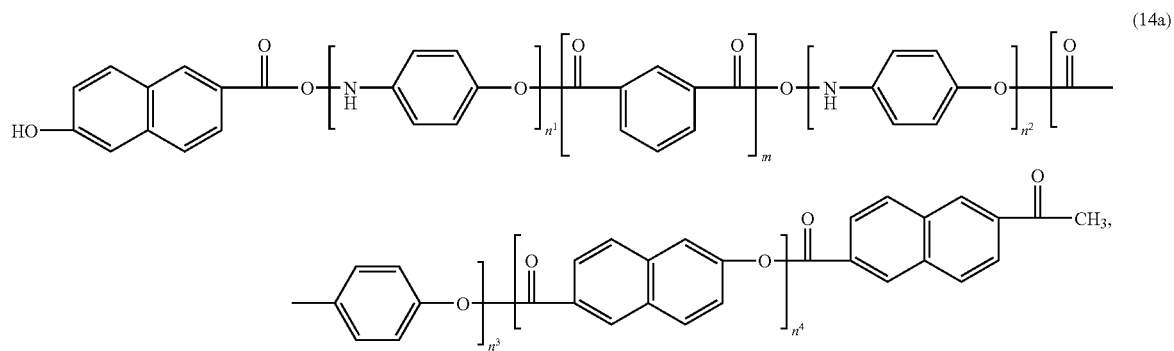
(14a)
wherein m, $n^1$, $n^2$, $n^3$ and $n^4$ are as defined in Formula 13a;
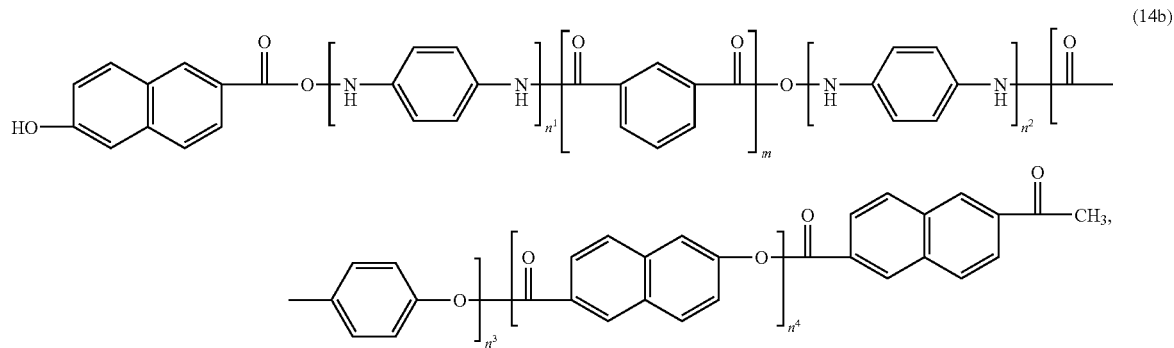
(14b)
wherein m, $n^1$, $n^2$, $n^3$ and $n^4$ are as defined in Formula 13a;
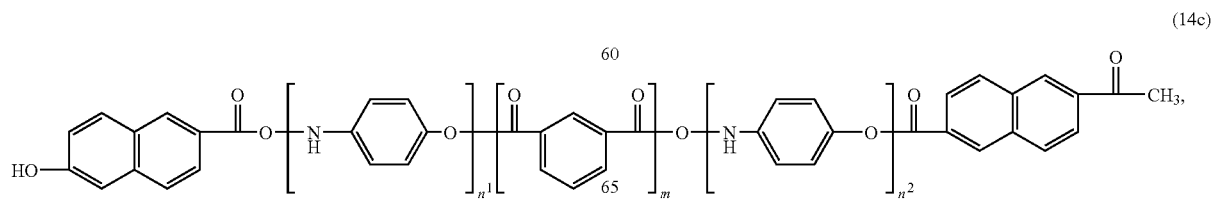
(14c)

wherein m, $n^1$ and $n^2$ are as defined in Formula 13c;
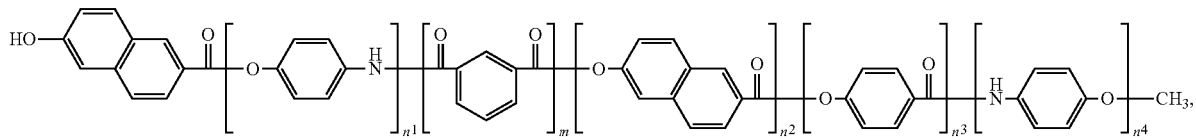
(14d)
wherein m, $n^1$, $n^2$, $n^3$ and $n^4$ are as defined in Formula 13a;
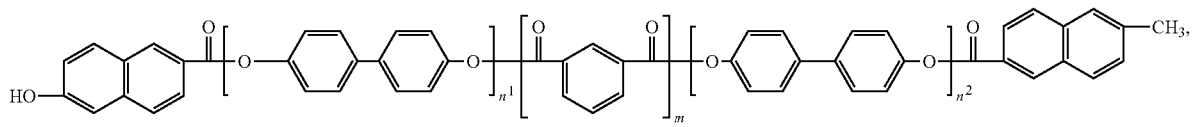
(14e)
wherein m, $n^1$ and $n^2$ are as defined in Formula 13c;
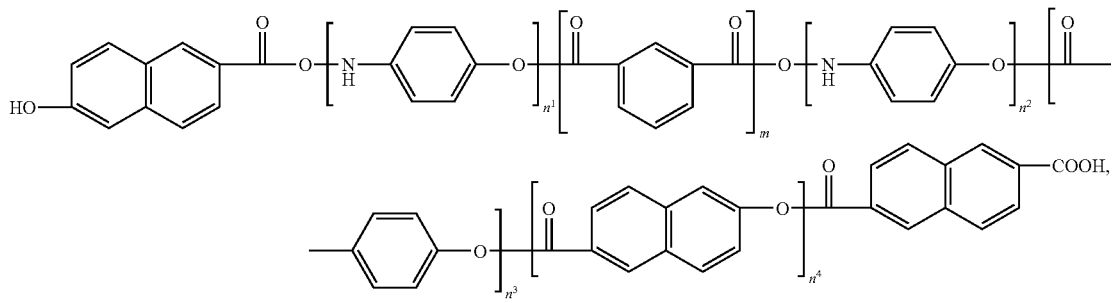
(15a)
wherein m, $n^1$, $n^2$, $n^3$ and $n^4$ are as defined in Formula 13a;
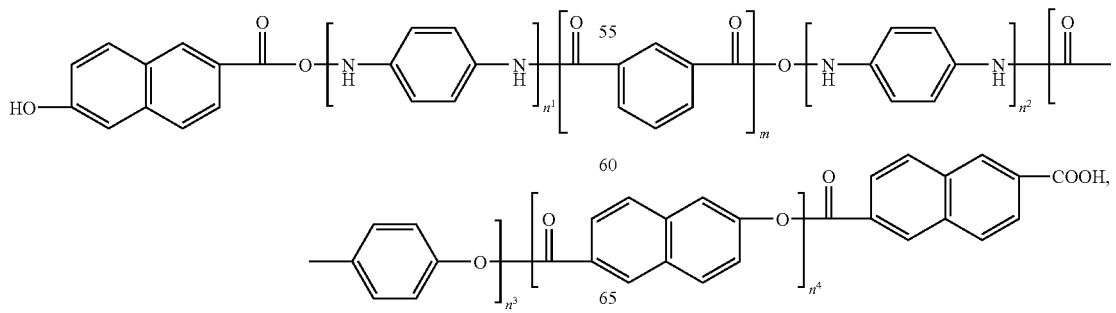
(15b)

wherein m, $n^1$, $n^2$, $n^3$ and $n^4$ are as defined in Formula 13a;
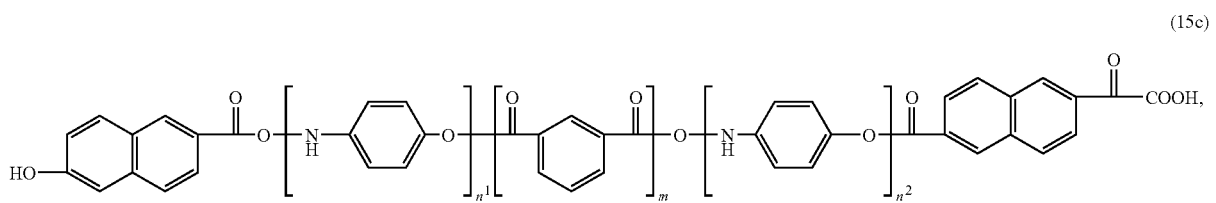
(15c)
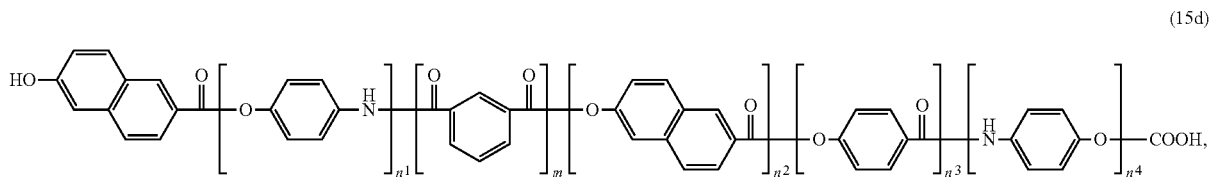
(15d)
wherein m, $n^1$, $n^2$, $n^3$ and $n^4$ are as defined in Formula 13a;
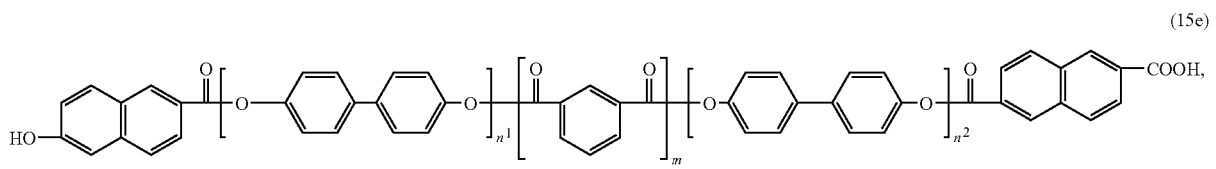
(15e)
wherein m, $n^1$ and $n^2$ are as defined in Formula 13c;
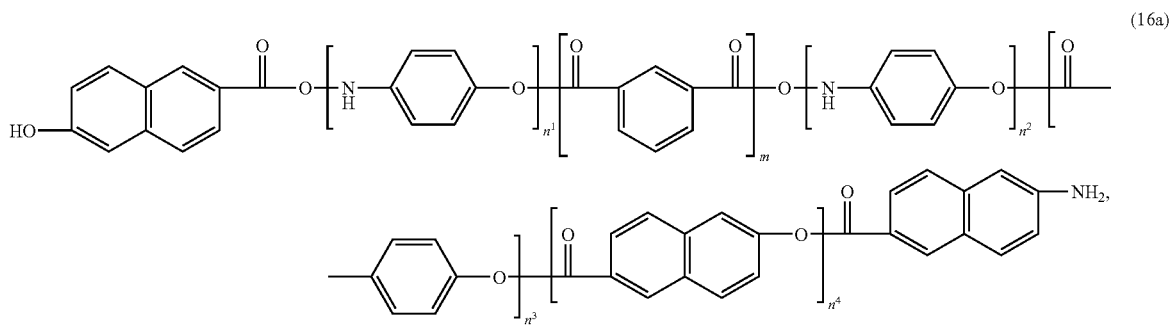
(16a)
wherein m, $n^1$, $n^2$, $n^3$ and $n^4$ are as defined in Formula 13a;
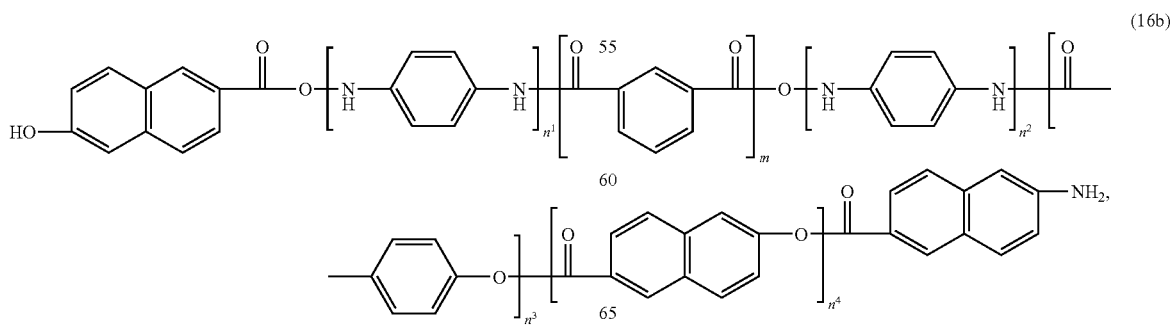
(16b)

wherein m, $n^1$, $n^2$, $n^3$ and $n^4$ are as defined in Formula 13a;

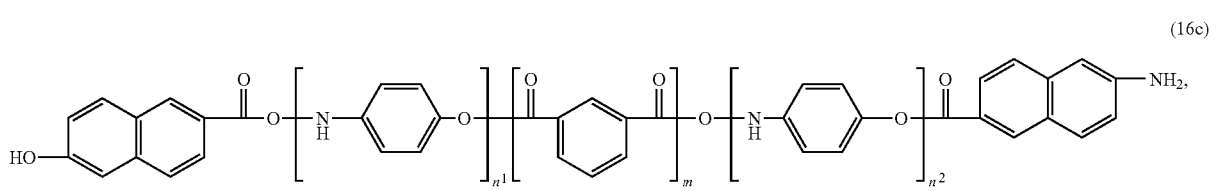
(16c)

wherein m, $n^1$ and $n^2$ are as defined in Formula 13c;

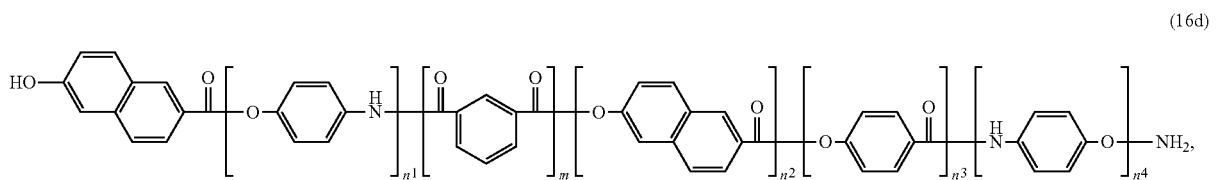
(16d)

wherein m, $n^1$, $n^2$, $n^3$ and $n^4$ are as defined in Formula 13a;

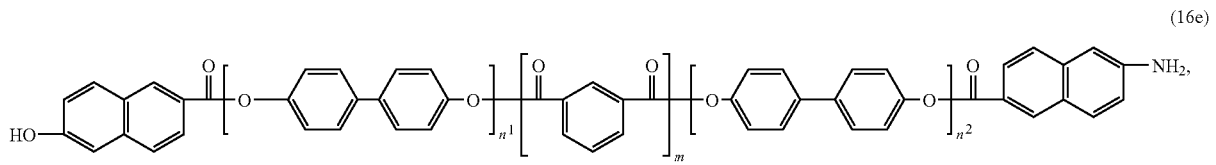
(16e)

wherein m, $n^1$ and $n^2$ are as defined in Formula 13c;

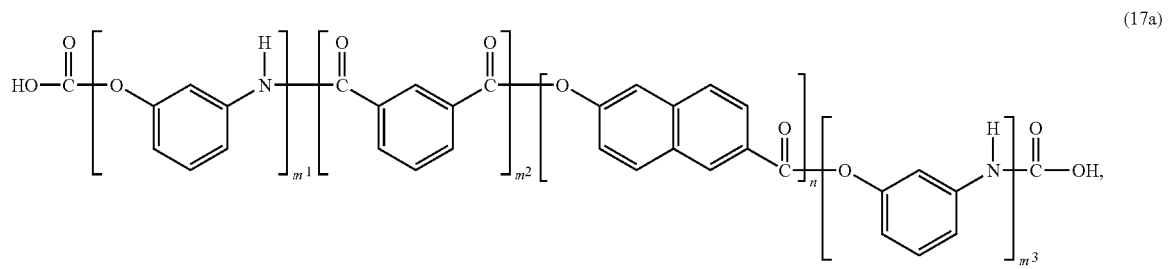
(17a)

wherein $m^1$, $m^2$, $m^3$ and n are each independently an integer from about 1 to about 100, specifically about 2 to about 90, more specifically about 10 to about 80 and $m^1$, $m^2$ and $m^3$ satisfy the relationship about $1 \leq m^1+m^2+m^3 \leq$ about 100, about $2 \leq m^1+m^2+m^3 \leq$ about 99, about $10 \leq m^1+m^2+m^3 \leq$ about 90;

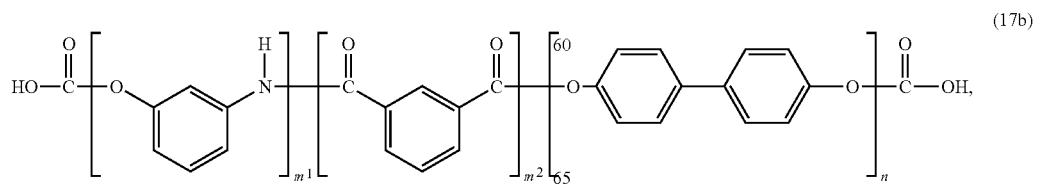
(17b)

wherein $m^1$, $m^2$ and n are each independently an integer from about 1 to about 100, specifically about 2 to about 90, more specifically about 10 to about 80, and $m^1$ and $m^2$ satisfy the relationship about $1 \leq m^1 + m^2 \leq$ about 100, about $2 \leq m^1 + m^2 \leq$ about 99, about $10 \leq m^1 + m^2 \leq$ about 90;

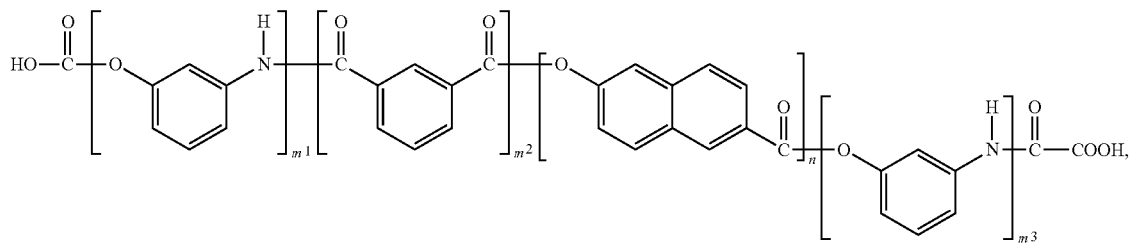

(17c)

wherein $m^1$, $m^2$, $m^3$ and n are as defined in Formula 17a;

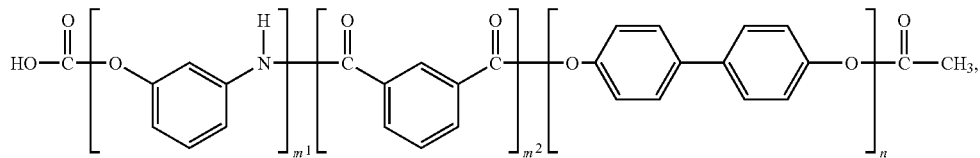

(17d)

wherein $m^1$, $m^2$ and n are as defined in Formula 17b; and

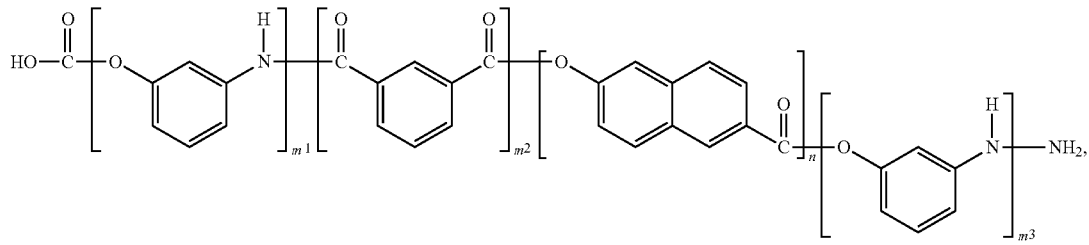

(17e)

wherein $m^1$, $m^2$, $m^3$ and n are as defined in Formula 17a.

In an embodiment, the liquid crystal polymer or oligomer of Formula 1 is not limited to the compounds of Formulas 13a-13e, 14a-14e, 15a-15e, 16a-16e and 17a-17b.

In an exemplary embodiment, the liquid crystal polymer or oligomer may have a number average molecular weight of about 1,000 to about 100,000 Daltons, specifically about 2,000 to about 99,000 Daltons, more specifically about 10,000 to about 90,000 Daltons. In another exemplary embodiment, the liquid crystal polymer or oligomer may have a number average molecular weight from about 1,000 to about 50,000 Daltons. In an exemplary embodiment, the liquid crystal oligomer may have a number average molecular weight of about 1,000 to about 9,000 Daltons and the liquid crystal polymer may have a number average molecular weight greater than about 9,000 and less than or equal to about 100,000 Daltons.

The liquid crystal polymer or oligomer may be prepared by any suitable method. For example, the liquid crystal polymer or oligomer can be prepared by the following procedure.

First, isophthalic acid, 6-hydroxy-2-naphthoic acid, 4-hydroxybenzoic acid, 4-aminophenol and acetic anhydride are introduced into a reactor equipped with a condenser and a mechanical stirrer. The mixture is slowly heated to 140° C. under a nitrogen atmosphere and allowed to react (acetylation) for 3 hours (hr) while maintaining a constant reaction temperature of 140° C. After completion of the acetylation, the reaction mixture is heated to 270° C. while removing acetic acid as a by-product and unreacted acetic anhydride. The reaction is continued for 30 minutes (min) to yield a soluble liquid crystal amide-ester oligomer or polymer having one or more terminal hydroxyl groups.

It is understood that the liquid crystal polymer or oligomer is highly soluble in an organic solvent due to the introduced structural unit having a kink structure. This high solubility makes the liquid crystal polymer or oligomer highly processable. A prepreg is a composite material produced by impregnating a polymer (i.e., polymer resin or resin) into a reinforcing material, such as a woven glass fiber or a carbon fiber, and drying the polymer resin. A molten polymer may not be suitable for direct use as a prepreg material because high processing temperature and high melt viscosity of the molten polymer may make it difficult to impregnate the molten polymer into a reinforcing material. An impregnating solution of a polymer in a solvent can also be used to produce a prepreg. However, if the polymer has a high molecular weight, the viscosity of the solution increases with increasing concentration, making it difficult for the impregnating solution to have a high solids content. An impregnating solution having a low solids content is impregnated and dried to remove the solvent, leaving a small amount of the polymer resin in a prepreg. In an embodiment, the use of the impregnating solution having a low solids content may makes it difficult to achieve a high resin content of the prepreg. Accordingly, it may be desirable to repeat the impregnation of the impregnating solution several times because one-time impregnation may not ensure that a desired amount of the polymer is present in the prepreg after drying. However, repeated impregnation may lead to low processing productivity. In contrast, the high solubility of the liquid crystal polymer or oligomer of Formula 1 in an organic solvent enables the preparation of an impregnating solution with low viscosity even at a high solids content. Therefore, the impregnation rate of the liquid crystal polymer or oligomer can be easily increased by one-time impregnation of the impregnating solution in the production of a prepreg, ensuring high productivity of the impregnation.

When the composition is disposed as a thin film or is impregnated into a reinforcing material, followed by curing, the terminal hydroxyl groups of the liquid crystal polymer or oligomer are chemically bonded to the maleimide groups at both ends of the bismaleimide cross-linking agent to form a cross-linked network, which can provide an improvement in the physical properties of the thin film or the reinforcing material. In an embodiment, the composition may produce synergistic effects in terms of physical properties by the thermal curing of the bismaleimide cross-linking agent while maintaining good solvent solubility, high heat resistance, low dielectric properties, low thermal expansion properties and low moisture absorption properties of the liquid crystal polymer or oligomer. In addition, the mixing of the high-molecular weight liquid crystal polymer and the low-molecular weight bismaleimide cross-linking agent can be advantageous for controlling the viscosity of the composition. In an exemplary embodiment, the composition may have a viscosity of about 1,000 centipoise (Cps) to about 15,000 Cps, specifically about 2,000 Cps to about 10,000 Cps, more specifically about 5,000 Cps at a solids content of about 10 to about 90 weight percent (wt %), specifically about 20 to about 80 wt %, more specifically about 50 wt %.

In an exemplary embodiment, the bismaleimide cross-linking agent may be a bismaleimide compound represented by Formula 18:

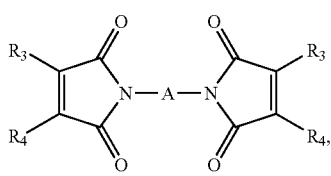
(18)

wherein $R_3$ and $R_4$ are each independently H or $CH_3$, and A is a divalent group including a $C_2$-$C_{60}$ alkyl or aromatic group or is at least one structural unit selected from the group consisting of units represented by Formula 18a:

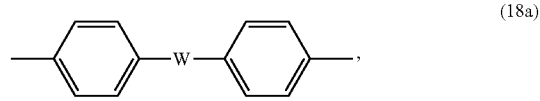
(18a)

wherein W is independently selected from the group consisting of O, S, CO, SO, $SO_2$, a straight or branched $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, a substituted or unsubstituted $C_4$-$C_{30}$ oxyheteroarylene group, and a linking group represented by Formula 18b:

$$—B_1—Ar^5—B_2— \quad (18b),$$

wherein $B_1$ and $B_2$ are each independently selected from the group consisting of O, S, CO, SO, $SO_2$, CONH and COO, and $Ar^5$ is a linking group selected from the group consisting of Formula 18c:

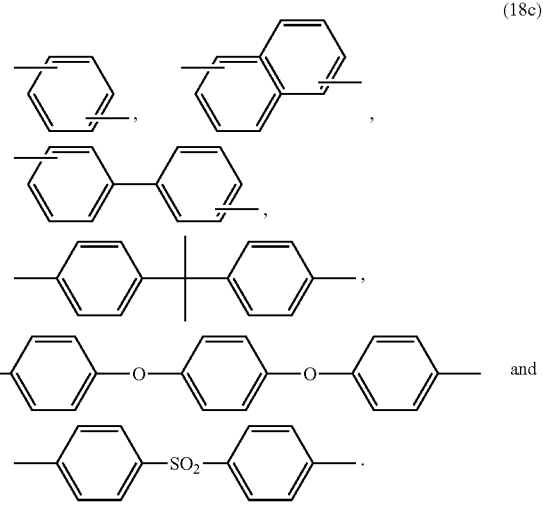
(18c)

In an exemplary embodiment, A in Formula 18 may include at least one linking group selected from the group consisting of Formula 19:

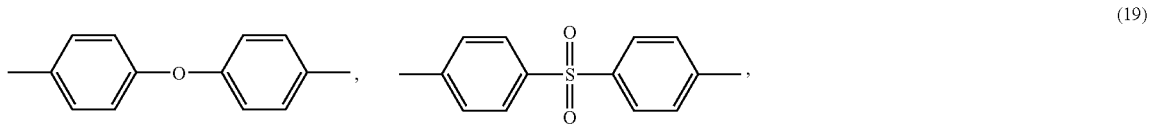
(19)

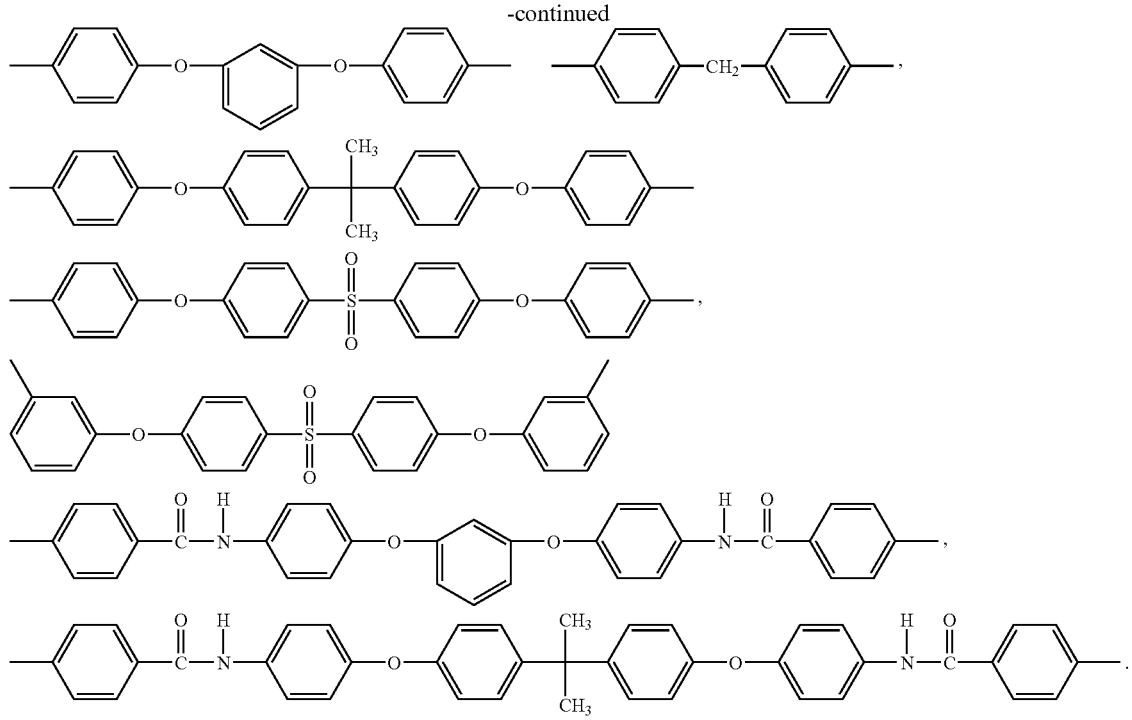
In an exemplary embodiment, the bismaleimide cross-linking agent may be selected from the group consisting of the compounds of Formulas 20a to 20r:
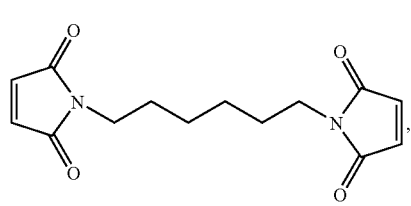
(20a)
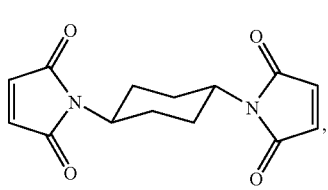
(20b)
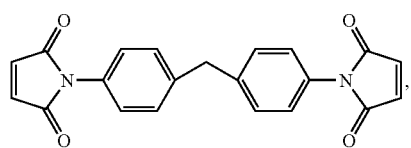
(20c)
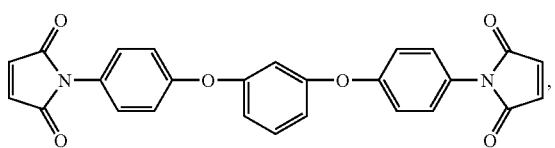
(20d)
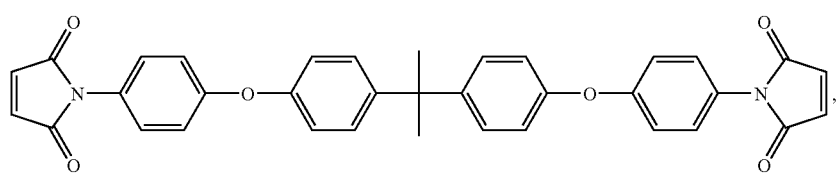
(20e)
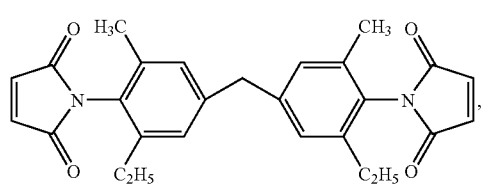
(20f)
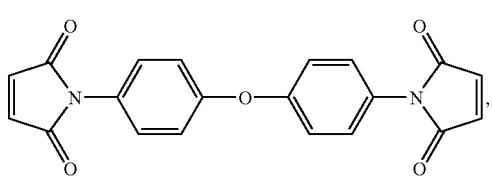
(20g)

-continued
(20h)
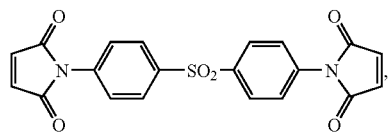
(20i)
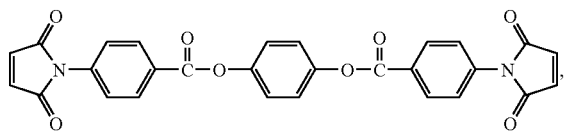
(20j)
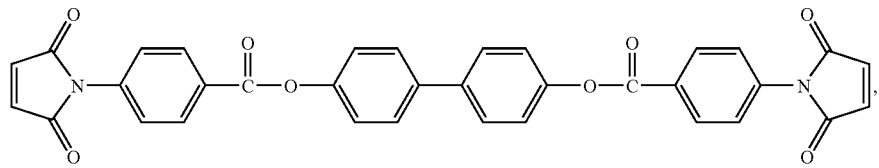
(20k)
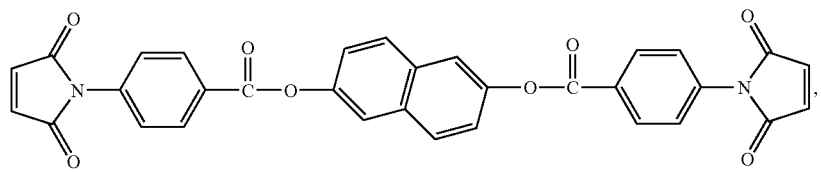
(20l)
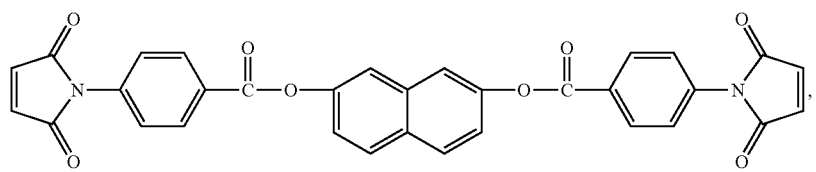
(20m)
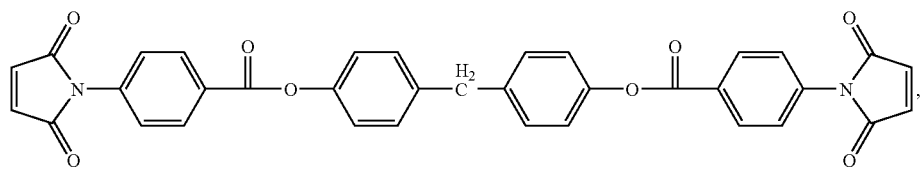
(20n)
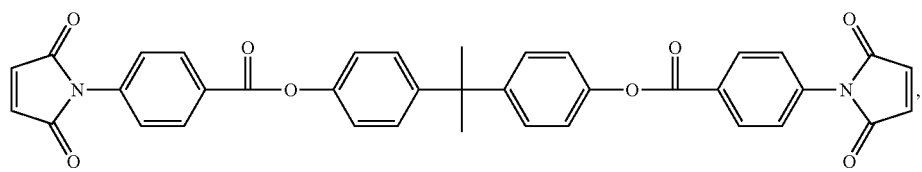
(20o)
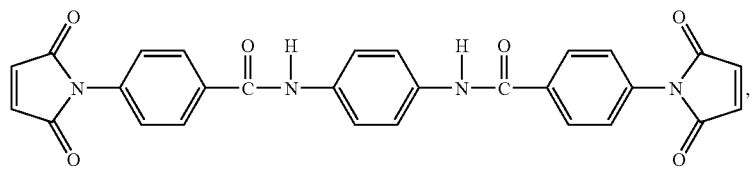
(20p)
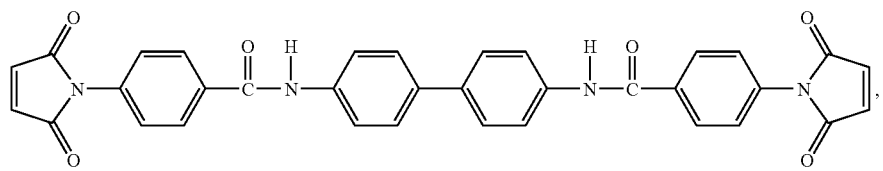
(20q)
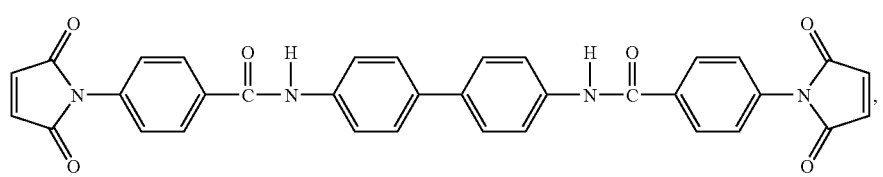

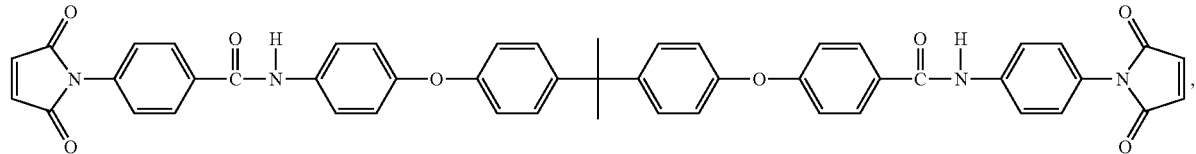

(20r)

and a combination thereof.

In an embodiment, the bismaleimide cross-linking agent is not limited to the bismaleimide compounds of Formulas 20a to 20r.

Each of the bismaleimide compounds of Formulas 20a to 20r can be prepared by contacting a corresponding aromatic diamine with maleic anhydride to obtain an aromatic bismaleimide acid and by ring closure of the aromatic bismaleimide acid.

In an exemplary embodiment, the composition may further include an epoxy compound. In another exemplary embodiment, the composition may include an epoxy compound and not include the bismaleimide compound. The epoxy compound may be in the form of a resin. Thus a resin (e.g., epoxy resin) may comprise the epoxy compound. Exemplary epoxy resins include phenolic glycidyl ether type epoxy resins, such as cresol novolac type epoxy resins, phenol novolac type epoxy resins, naphthol-modified novolac type epoxy resins, bisphenol A type epoxy resins, bisphenol F type epoxy resins, biphenyl type epoxy resins, and triphenyl type epoxy resins; alcoholic glycidyl type ether epoxy resins, such as polypropylene glycol glycidyl ether and hydrogenated bisphenol A type epoxy resins; dicyclopentadiene type epoxy resins having a dicyclopentadiene group; naphthalene type epoxy resins having a naphthalene group; dihydroxybenzopyran type epoxy resins; dihydroxydinaphthalene type epoxy resins; glycidyl ester type epoxy resins, such as a ester epoxy resin prepared from hexahydrophthalic anhydride or a dimer acid; glycidylamine type epoxy resins, such as glycidylamine type epoxy resin prepared from a polyamine, such as diaminophenylmethane; alicyclic epoxy resins; brominated epoxy resins, or the like or a combination thereof. Epoxy resins may be used alone or in combination.

In an exemplary embodiment, the epoxy compound may include a monovalent radical of Formula 21:

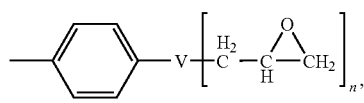

(21)

wherein V is O, S, P or N, provided that when V is O or S, n is 1, and when V is P or N, n is 1 or 2.

A plurality of radicals of Formula 21 may be included in the epoxy compound. In an exemplary embodiment, the epoxy compound may have an epoxy equivalent weight of about 100 to about 400 grams per equivalent ("g/eq"), specifically about 150 to about 350 g/eq, more specifically about 200 to about 300 g/eq. For example, the epoxy compound may include two radicals of Formula 21 and may have an epoxy equivalent weight of about 100 to about 150 g/eq. Also, the epoxy compound may include two or more radicals of Formula 21 and may have an epoxy equivalent weight of about 150 to about 200 g/eq., specifically about 200 to about 250 g/eq., more specifically about 250 to about 300 g/eq.

In an exemplary embodiment, the composition may further include a liquid crystalline thermoset oligomer of Formula 22:

(22)

wherein $R^5$ is represented by Formula 23:

(23), wherein $X^3$ and $Y^3$ are each independently selected from the group consisting of O, CO and NR'' (in which R'' is independently selected from the group consisting of a hydrogen atom, a substituted or unsubstituted $C_1$-$C_{20}$ alkyl group, and a substituted or unsubstituted $C_6$-$C_{30}$ aryl group), with the proviso that at least one of $X^3$ and $Y^3$ is NR'', and $Ar^5$ includes at least one divalent aromatic or alicyclic organic group selected from the group consisting of Formula 24:

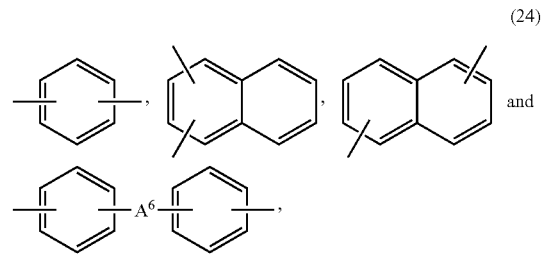

(24)

wherein $A^6$ represents a single bond or is selected from the group consisting of O, S, CO, SO, $SO_2$, a straight or branched $C_1$-$C_{20}$ alkyl group, a substituted or unsubstituted $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, a substituted or unsubstituted $C_4$-$C_{30}$ oxyheteroarylene group, a divalent linking group represented by Formula 24a:

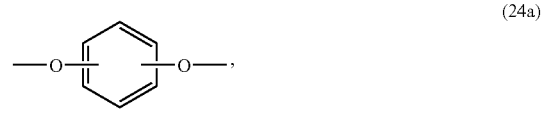

(24a)

wherein at least one of the CH moieties present in the aromatic ring is optionally replaced by a heteroatom selected from the group consisting of N, O, S and P, and a divalent linking group represented by Formula 24b:

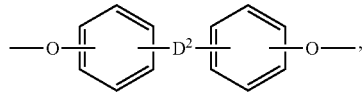
(24b)

wherein at least one of the CH moieties present in the aromatic rings is optionally replaced by a heteroatom independently selected from the group consisting of N, O, S and P, and $D^2$ is $SO_2$ or a straight or branched $C_1$-$C_{20}$ alkyl group; $R^6$ is represented by Formula 25:

$$-X^5-Ar^7-Y^5- \qquad (25),$$

wherein $X^5$ and $Y^5$ are each independently O or CO, and $Ar^7$ includes at least one divalent aromatic organic group independently selected from the group consisting of Formula 26:

(26)

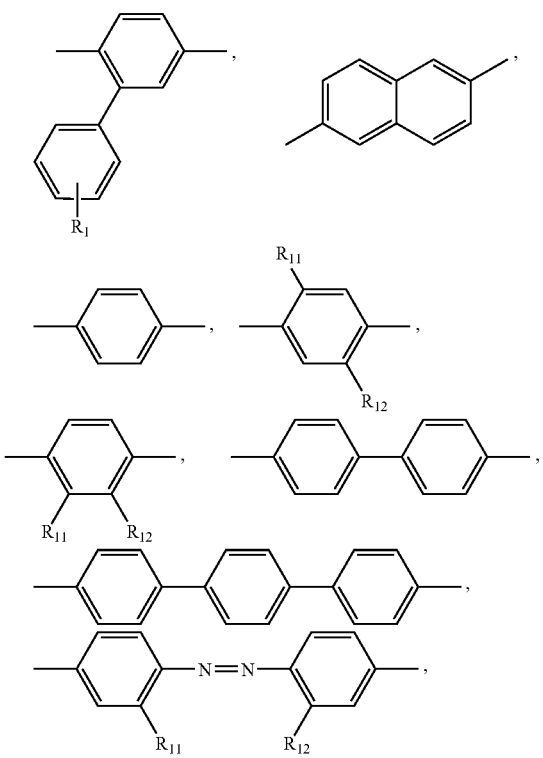

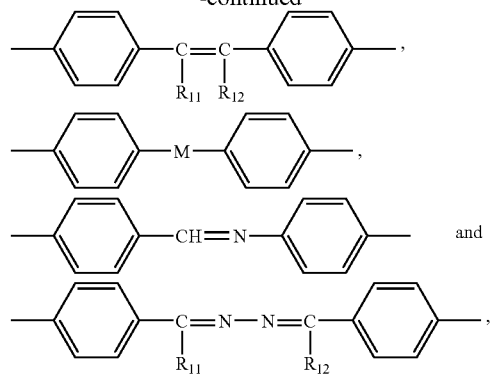

wherein $R_{11}$ and $R_{12}$ are each independently a proton, a $C_1$-$C_5$ alkyl group or a halogen group, and M is selected from the group consisting of O, S, CO, SO, $SO_2$, a straight or branched $C_1$-$C_{20}$ alkyl group, a substituted or unsubstituted $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, and a substituted or unsubstituted $C_4$-$C_{30}$ oxyheteroarylene group; $Z^5$ and $Z^6$ are each independently a thermally cross-linkable reactive group having at least one terminal multiple bond; and i and j are each independently an integer from about 1 to about 50, specifically about 2 to about 40, more specifically about 5 to about 30.

In an exemplary embodiment, i and j in Formula 22 satisfy the relationship about $0.05 < i/i+j+2 \leq$ about 0.6, specifically about $0.1 \leq i/i+j+2 \leq$ about 0.5, more specifically about $0.1 \leq i/i+j+2 \leq$ about 0.4.

In an exemplary embodiment, $R^5$ in Formula 22 may be an aromatic or alicyclic structural unit having a kink structure or may be represented by Formula 25.

In an exemplary embodiment, $R^6$ in Formula 22 may be represented by Formula 6.

In an exemplary embodiment, $Z^5$ and $Z^6$ in Formula 22 may be the same or different and may be each independently selected from the group consisting of maleimide, nadimide, citraconimide, phthalimide, acetylene, propargyl ether, benzocyclobutene, cyanate, a combination thereof, and substituents and derivatives thereof.

Exemplary liquid crystalline thermoset oligomers include, but are not limited to, the compounds of Formulas 27a to 27k:

(27a)

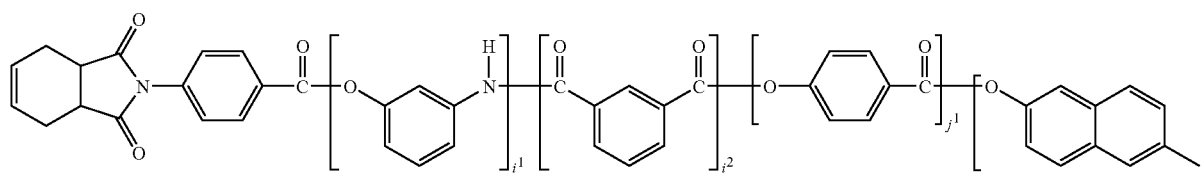

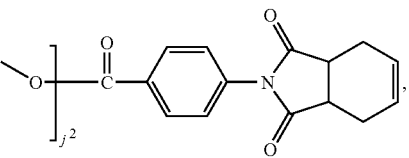
(27b)
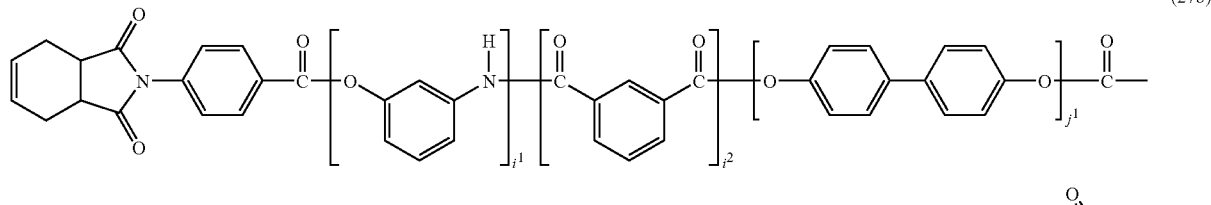
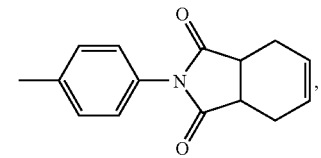
(27c)
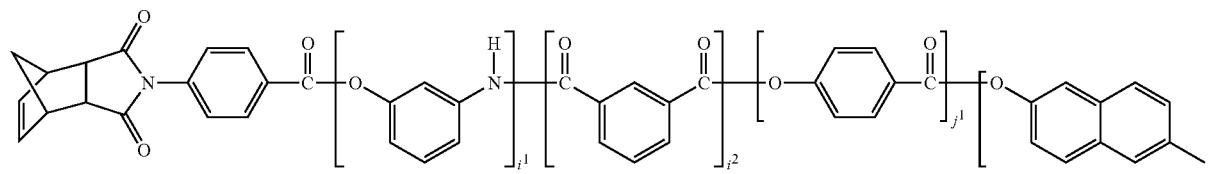
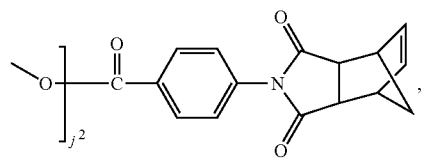
(27d)
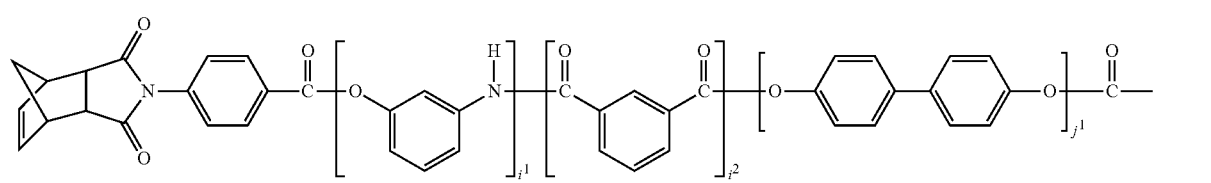
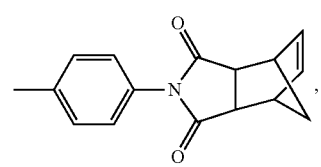
(27e)
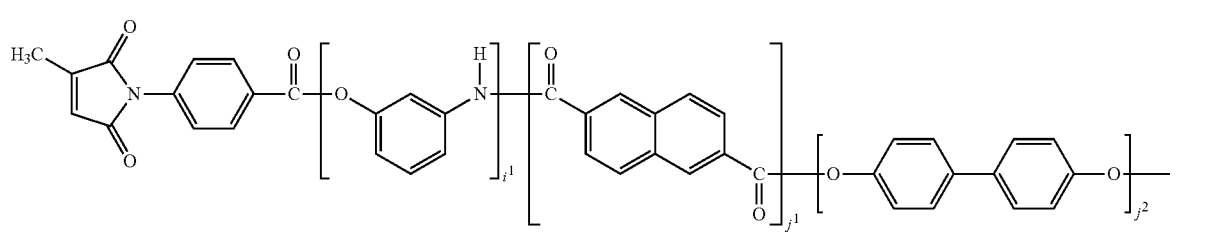
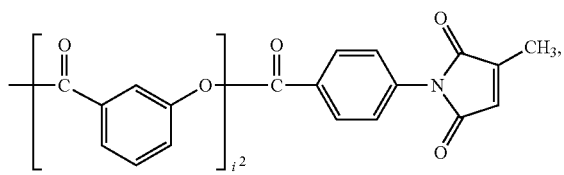

(27f)
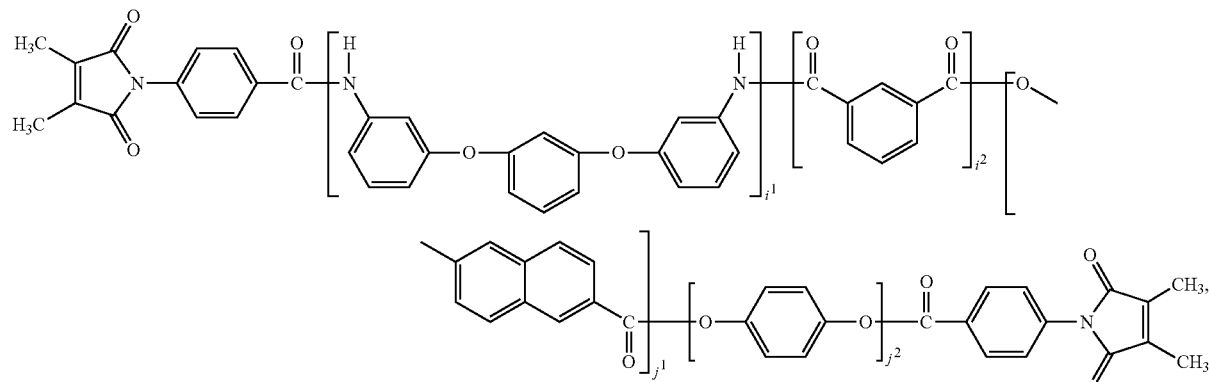
(27g)
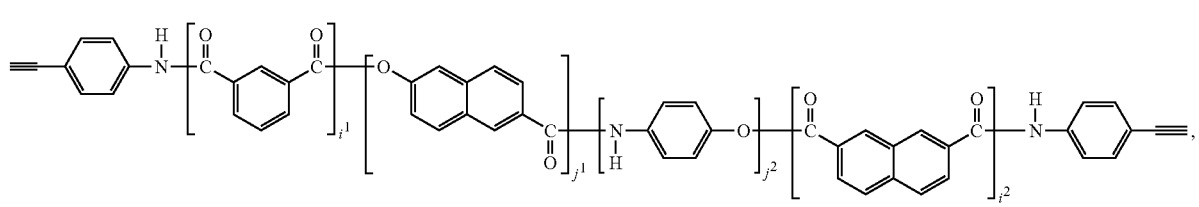
(27h)
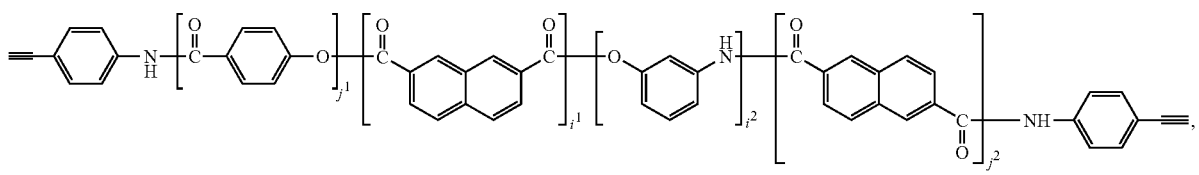
(27i)
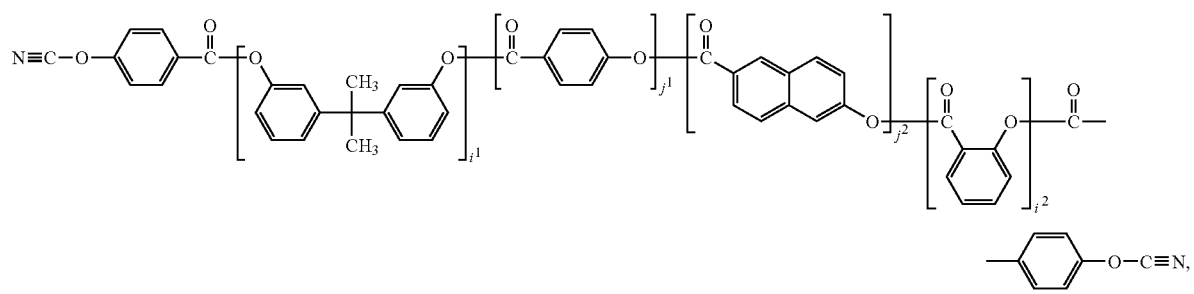
(27j)
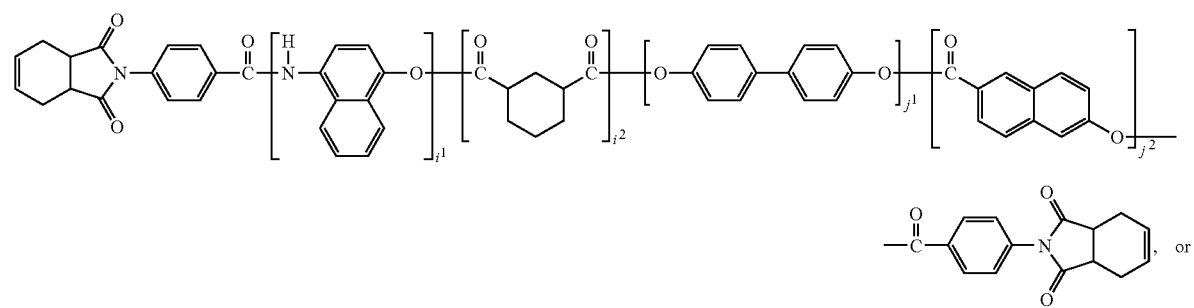

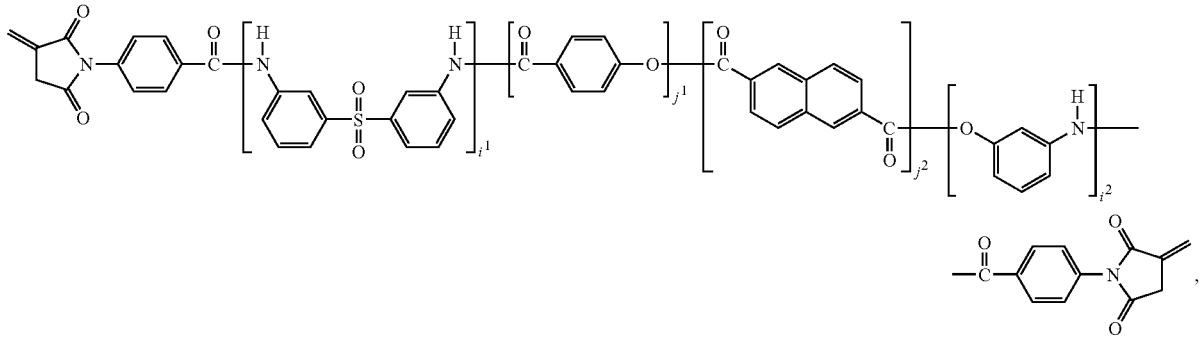

(27k)

or a combination thereof.

In Formulas 27a to 27k, $i^1$, $i^2$, $j^1$ and $j^2$ are each independently a positive integer, and in an embodiment $i^1$, $i^2$, $j^1$ and $j^2$ may be each independently an integer from about 1 to about 50, specifically about 2 to about 40, more specifically about 5 to about 30.

In an exemplary embodiment, the liquid crystalline thermoset oligomer may have a molecular weight of about 500 to about 9,000 Daltons, specifically about 1000 to about 8,000 Daltons, more specifically 2000 to about 6,000 Daltons. The liquid crystalline thermoset oligomer may have a molecular weight of about 1,000 to about 9,000. The liquid crystalline thermoset oligomer having a molecular weight lower than about 500 is liable to be brittle due to its high cross-linking density. Also, the liquid crystalline thermoset oligomer having a molecular weight higher than about 9,000 is very viscous in a solvent, resulting in poor processability.

Each of the aromatic rings of the structural units constituting the liquid crystalline thermoset oligomer may be substituted with an amide, ester, carboxyl, alkoxy, aryl or fluoromethyl group, or the like.

In an exemplary embodiment, the composition may further include an organic solvent. The organic solvent may be a polar aprotic solvent. The organic solvent may be selected from the group consisting of N,N-dimethylacetamide, N-methylpyrrolidone ("NMP"), N-methylcaprolactam, N,N-dimethylformamide, N,N-diethylformamide, N,N-diethylacetamide, N-methylpropionamide, dimethylsulfoxide, γ-butyrolactone, dimethylimidazolidinone, tetramethylphosphoramide, ethyl cellulose acetate or the like or a combination thereof. Optionally, a mixture of the foregoing solvents may also be used.

In an exemplary embodiment, the liquid crystal polymer or oligomer may be present in an amount not less than about 5 parts by weight but less than about 100 parts by weight, specifically about 10 parts by weight to about 90 parts by weight, more specifically about 20 parts by weight to about 80 parts by weight, based on 100 parts by weight of the composition. For example, the liquid crystal polymer or oligomer may be present in an amount of about 5 to about 95 parts by weight, about 10 to about 50 parts by weight or about 10 to about 30 parts by weight, based on 100 parts by weight of the composition.

In an exemplary embodiment, the composition may include about 5 to about 95 parts by weight of the liquid crystal polymer or oligomer, based on 100 parts by weight of the organic solvent. In an exemplary embodiment, the composition may include about 5 to about 100 parts by weight, specifically about 10 to about 90 parts by weight, more specifically about 20 to about 80 parts by weight of the bismaleimide compound (i.e., the bismaleimide cross-linking agent), the epoxy compound or a combination thereof, based on 100 parts by weight of the organic solvent. There is no particular limitation on the mixing ratio of the liquid crystal polymer or oligomer to the bismaleimide cross-linking agent or the epoxy compound. For example, the liquid crystalline thermoset oligomer may be mixed with the bismaleimide cross-linking agent or the epoxy compound in a weight ratio of about 1:9 to about 9:1, specifically about 1:8 to about 8:1, more specifically about 1:7 to about 7:1.

In an exemplary embodiment, the liquid crystal polymer or oligomer, the bismaleimide cross-linking agent and the epoxy compound may be present in amounts of about 20 to about 80 parts by weight, about 5 to about 30 parts by weight and about 5 to about 30 parts by weight, respectively, based on the total solids content of the composition.

In an exemplary embodiment, the liquid crystal polymer or oligomer, the liquid crystalline thermoset oligomer, the bismaleimide cross-linking agent and the epoxy compound may be present in amounts of about 10 to about 40 parts by weight, about 10 to about 40 parts by weight, about 5 to about 30 parts by weight and about 5 to about 30 parts by weight, respectively, based on the total solids content of the composition.

So long as the inherent characteristics of the composition are not impaired, the composition may further include at least one polymer selected from thermosetting resins, thermoplastic resins, and the like and oligomers and elastomers thereof. Any polymer, which is routinely used in the related art, may be used without limitation. Exemplary polymers include: phosphorus compounds, such as phosphoric acid ester and melamine phosphate; elastomers, such as nitrogenous compounds such as melamine and benzoguanamine, oxazine ring-containing compounds, silicon compounds, polyimide, polyvinyl acetal, phenoxy resins, acrylic resins, acrylic resins having hydroxyl groups, acrylic resins having carboxyl groups, alkyd resins, thermoplastic polyurethane resins, polybutadiene, butadiene-acrylonitrile copolymers, polychloroprene, butadiene-styrene copolymers, polyisoprene, butyl rubbers, fluorinated rubbers, and natural rubbers; thermoplastic resins, for example, styrene-isoprene rubbers, acrylic rubbers, epoxidized butadiene, maleated butadiene, polyethylene, polypropylene, polyethylene-propylene copolymers, polyvinyl chloride, polyvinylidene chloride, polystyrene, polyvinyl toluene, polyvinyl phenol, acrylonitrile styrene ("AS") resins, acrylonitrile butadiene styrene ("ABS") resins, methacrylate butadiene styrene ("MBS") resins, poly-4-fluoroethylene, fluoroethylene-propylene copolymers, 4-fluoroethylene-6-fluoroethylene copolymers, vinyl compound polymers such as vinylidene fluoride, polycarbonate, polyester carbonate, polyphenylene ether, polysulfone, polyester, polyether sulfone, polyamide, polyamide imide, polyester imide, polyphenylene sulfite, and low-molecular weight polymers thereof; (meth)acrylate, epoxy (meth)acrylate, poly(meth)acrylate such as di(meth)acryloxybisphenol, styrene, vinylpyrrolidone, diacrylphthalate, divinylbenzene, polyallyl compounds such as diallylbenzene, diallyl ether bisphenol, trialkenyl isocyanurate and dicyclopentadiene and prepolymers thereof, phenolic resins, monomers containing at least one polymerizable double bond such as unsaturated polyester, and prepolymers thereof, curable monomers, and prepolymers such as polyisocyanate and the like.

If desired, the composition may further include one or more additives, such as fillers, softeners, plasticizers, antioxidants, flame retardants, auxiliary flame retardants, lubricants, antistatic agents, colorants, heat stabilizers, light stabilizers, and UV absorbers and the like.

Exemplary fillers include organic fillers, such as epoxy, melamine, urea, benzoguanamine resin powder and styrene resin powder.

Inorganic fillers, which are routinely used in the related art, can be used without limitation. Exemplary inorganic fillers include natural silica, fused silica, amorphous silica, hollow silica, metal hydroxides such as aluminum hydroxide, boehmite and magnesium hydroxide, molybdenum compounds such as molybdenum oxide and zinc molybdate, zinc borate, zinc stannate, aluminum borate, potassium titanate, magnesium sulfate, silicon carbide, zinc oxide, silicon nitride, silicon dioxide, aluminum titanate, barium titanate, barium strontium titanate and aluminum oxide, alumina, clay, kaolin, talc, calcined clay, calcined kaolin, calcined talc, mica, and short glass fibers and the like.

Exemplary antioxidants include phosphorus-containing antioxidants, phenolic antioxidants, and sulfur-containing antioxidants. These antioxidants may be used alone or in combination.

Exemplary plasticizers include polyethylene glycol, polyamide oligomers, ethylenebisstearoamide, phthalic acid ester, polystyrene oligomers, liquid paraffin, polyethylene wax, and silicone oil. These plasticizers may be used alone or in combination.

Flame retardants, which are routinely used in the related art, can be used without limitation. Exemplary flame retardants include brominated polymers, such as brominated polystyrene, brominated syndiotactic polystyrene and brominated polyphenylene ether, and brominated aromatic compounds such as brominated diphenylalkane, brominated diphenyl ether. Auxiliary flame retardants, which are routinely used in the related art, can be used without limitation. Exemplary auxiliary flame retardants include antimony compounds, such as antimony trioxide. The flame retardants and the auxiliary flame retardants may be used alone or in combination.

The composition can be prepared by blending the liquid crystal polymer or oligomer with either the bismaleimide cross-linking agent or the epoxy resin or both at room temperature. The blending can be performed by various methods, including but not limited to, mixing and melt-mixing. In an exemplary embodiment, the composition is prepared by simply melt-mixing the liquid crystal polymer or oligomer with the bismaleimide cross-linking agent or by dissolving the liquid crystal polymer or the oligomer and the bismaleimide cross-linking agent with stirring in an organic solvent, such as methyl ethyl ketone, N-methylpyrrolidone, dimethylformamide, dimethylacetamide, toluene or xylene.

The composition can be applied as a varnish for impregnation or coating applications.

In accordance with another exemplary embodiment, disclosed is a resin cured product including a polymer derived from the liquid crystal polymer or oligomer and a cross-linking agent comprising the bismaleimide cross-linking agent, the epoxy resin or a combination thereof.

The resin cured product can be produced by disposing and drying the composition. The resin cured product can be molded into a sheet or a board. The use of the liquid crystal polymer or oligomer and the cross-linking agent enables cross-linking of the composition at high density, which ensures markedly improved mechanical and thermal properties of the final product.

A prepreg can be produced using the composition. The prepreg is produced by impregnating the composition into a reinforcing material. The composition can be impregnated into a reinforcing material and cured to produce a sheet-like prepreg. Exemplary reinforcing materials include, but are not particularly limited to, woven glass cloth, woven alumina glass fibers, glass fiber non-woven fabrics, cellulose non-woven fabrics, woven carbon fibers, and polymer fabrics and the like. Other non-limiting examples of such reinforcing materials include: inorganic fibers, such as glass fibers, silica glass fibers, carbon fibers, alumina fibers, silicon carbide fibers, asbestos, rock wool, mineral wool, gypsum whisker, woven fabrics and non-woven fabrics thereof, and mixtures thereof; organic fibers, such as aromatic polyamide fibers, polyimide fibers, liquid crystal polyester, polyester fibers, fluorine fibers, and polybenzoxazole fibers; combined woven fabrics, such as glass fibers with polyamide fibers, glass fibers with carbon fibers, glass fibers with polyimide fibers, and glass fibers with liquid crystal aromatic polyester; inorganic papers, such as glass paper, mica paper and alumina paper; kraft paper, cotton paper, paper glass-combined paper, and mixed fibrous reinforcing materials composed of at least one of the above materials.

The prepreg can be produced by applying the composition to the reinforcing material or impregnating the composition into the reinforcing material, followed by drying to remove the solvent and form a resin cured product on the reinforcing material. The application, impregnation and drying may be carried out by methods known in the art. For example, the composition can be impregnated into the reinforcing material by dip coating or roll coating.

The amount of the resin cured product impregnated in the prepreg may be from about 40 to about 70 wt %, specifically about 45 to about 65 wt %, more specifically about 30 to about 60 wt %. If the resin cured product is contained in an amount of less than 40 wt %, the adhesion of the prepreg to the adjacent prepreg may be deteriorated. Meanwhile, if the resin cured product is contained in an amount of more than 70 wt %, the mechanical strength of the prepreg may be lowered and the dimensional stability of the prepreg may be worsened. The amount (e.g., wt %) of the resin cured product impregnated implies the sum of the amount of the resin cured product penetrating (e.g. disposed within) and attached (e.g. disposed on) to the reinforcing material and the amount of the resin cured product positioned on the surface of the reinforcing material, based on the total amount of the prepreg. The resin cured product positioned on the surface of the reinforcing material includes the resin cured product disposed (e.g. layered) on the surface of the reinforcing material.

The prepreg has a low coefficient of thermal expansion. For example, the prepreg may have a coefficient of thermal expansion of about 25 parts per million per degree centigrade (ppm/° C.) to about 20 ppm/° C., specifically about 22 ppm/° C. in the temperature range of 50 to 150° C.

In accordance with another exemplary embodiment, disclosed is a board including the resin cured product.

The board can be produced using the composition. Exemplary boards include, but are not limited to, layers of multilayer boards, metal clad laminates, and printed boards. The board may comprise a combination of the prepreg and a metal foil.

The board may have various forms. For example, the board may be in the form of a film. The film can be produced by disposing the composition as a thin film. Exemplary film formation processes include, but are not limited to: extrusion molding, in which the composition is molded through a die in an extruder to form a film; cast molding, in which the composition is cast to form a film; and dip molding, in which an inorganic substrate (e.g., glass) or a fabric substrate is dipped in a varnish of the composition, followed by molding to form a film.

In an exemplary embodiment, the board may be laminated with a metal foil. The metal foil may be a copper or aluminum foil. The thickness of the metal foil may be from about 5 to about 100 micrometers (μm), specifically about 10 to about 90 μm, more specifically about 20 to about 80 μm, depending on the desired application of the board. The metal foil may be bound to the surface of the resin laminate. The metal foil may be patterned. For example, a printed circuit board can be produced by circuit processing (e.g., etching) of the metal foil, and a multilayer printed circuit board can be produced by stacking the metal foil-coated laminate on a printed laminate, followed by circuit processing.

The metal foil laminate can be produced by applying the composition to a metal foil (e.g., a copper foil) or casting the composition on a metal foil (e.g., a copper foil), removing the solvent, followed by annealing. The solvent can be removed by evaporation. For example, the evaporation may be carried out by heating under reduced pressure or by flushing with a gas.

The composition can be applied to a surface by various processes, including roll coating, dip coating, spray coating, spin coating, curtain coating, slot coating and screen printing. Fine impurities contained in the composition in the form of a solution can be removed by filtration before application to or casting on the copper foil.

The printed circuit board can be produced by stacking an inner circuit board, the prepreg and a metal foil in accordance with a design specification, and melting and/or curing the prepreg under pressure and heat in a press to attach the metal foil to the inner board. The printed circuit board may have various structures. For example, the printed circuit board may include one or two conductive patterns disposed (e.g., formed) on one or both sides of the prepreg. The printed circuit board may be a laminate of at least one prepreg, two or more prepregs, for example, or four or eight prepregs. The conductive patterns can be disposed (e.g., formed) by etching.

The metal foil laminate can be used as an element of the printed circuit board. For example, the metal foil laminate may be a resin coated copper ("RCC"), a copper clad laminate ("CCL"), or the like or a combination thereof.

The resin cured product exhibits good adhesion to a metal foil. In an exemplary embodiment, the resin cured product has a peel strength to a copper foil of about 0.1 to about 2 kiloNewtons per meter (kN/m), specifically about 0.4 kN/m to about 1.9 kN/m, more specifically about 0.8 kN/m to about 1.4 kN/m. In an embodiment, the resin cured product may have a peel strength of equal to or greater than about 0.8 kN/m. For example, the peel strength of the resin cured product to a copper foil may be equal to or less than about 1.0 kN/m. The peel strength of the resin cured product to a copper foil may be equal to or less than 1.4 kN/m. The peel strength of the resin cured product is measured by 180° peel testing using a universal tensile machine ("UTM").

In accordance with yet another exemplary embodiment, disclosed is a storage medium including the printed circuit board.

The printed circuit board can be employed in storage media, such as a hard disk drive ("HDD"), a solid state drives ("SSD") or a memory sticks, or the like. In an exemplary embodiment, the printed circuit board may be electrically connected to one or more memory chips mounted thereon through or without leads.

The recent demand for thin and high driving speed storage media has led to high-density integration of printed circuit boards. Such high-density integration is achieved, for example, by stacking printed circuit boards, reducing the thickness of printed circuit boards and reducing the diameter and interval of through-holes of printed circuit boards. Flash memory chips are may provide for a higher driving speed SSD than a general HDD. For higher driving speed, printed circuit boards of an SSD is desirably thinner and more integrated than a printed circuit boards for the general HDD. However, when a thickness of a board is reduced, it is difficult to ensure sufficiently low dielectric properties and sufficiently low thermal expansion of the boards at optimum levels. In contrast, the printed circuit board according to an exemplary embodiment can be usefully employed in next generation storage media, such as in a SSD, due to their low thermal expansion and low dielectric properties.

Exemplary SSDs include complementary metal-oxide-semiconductor ("CMOS") devices, metal-oxide-semiconductor ("MOS") devices, conductor-insulator-semiconductor ("CIS") devices, electro-optical devices, single-atom devices, single-molecule devices, single-hole devices, single-atom PN junction devices, single-molecule PN junction devices, single-electron devices, one-dimensional solid state devices, second-dimensional solid state devices, and three-dimensional solid state devices.

A further description of exemplary embodiments is disclosed with reference to the following examples. However, these examples are given merely for the purpose of illustration and are not to be construed as limiting the scope of the embodiments.

EXAMPLES

Synthesis Example 1

Synthesis of a Liquid Crystal Oligomer End-Capped with Hydroxyl Groups

A 29.9 gram (g) (0.18 mole (mol)) quantity of isophthalic acid, 16.9 g (0.09 mol) of 6-hydroxyl-2-naphthoic acid, 18.6 g (0.135 mol) of 4-hydroxybenzoic acid, 24.6 g (0.225 mol) of 4-aminophenol and 68.9 g (0.675 mol) of acetic anhydride are introduced into a 500 milliliter (ml) three-neck flask equipped with a condenser and a mechanical stirrer. The mixture is slowly heated to 140° C. under a nitrogen atmosphere and allowed to react (by acetylation) for 3 hr while maintaining a constant reaction temperature. After the subsequent addition of 8.5 g (0.045 mol) of 6-hydroxy-2-naphthoic acid, the mixture is heated to 270° C. while removing acetic acid (a by-product) and unreacted acetic anhydride. The reaction is continued for 30 minutes (min), yielding a liquid crystal amide-ester oligomer having hydroxyl groups. The liquid crystal oligomer may have the structure of Formula 13d.

Synthesis Example 2

Synthesis of a Liquid Crystal Oligomer End-Capped with Hydroxyl Groups

A 26.6 g (0.16 mol) quantity of isophthalic acid, 9.4 g (0.05 mol) of 2-hydroxyl-6-naphthoic acid, 22.6 g (0.12 mol) of 4-hydroxybenzoic acid, 26.2 g (0.24 mol) of 4-aminophenol and 59.5 g (0.58 mol) of acetic anhydride are introduced into a 500 ml three-neck flask equipped with a condenser and a mechanical stirrer. The mixture is slowly heated to 140° C. under a nitrogen atmosphere and allowed to react (by acetylation) for 3 hr while maintaining a constant temperature. After the subsequent addition of 11.1 g (0.08 mol) of 2-hydroxy-6-naphthoic acid, the mixture is heated to 270° C. while removing acetic acid (a by-product) and unreacted acetic anhydride. The reaction is continued for 30 min, yielding a liquid crystal amide-ester oligomer having hydroxyl groups. The liquid crystal oligomer may have the structure of Formula 13a.

Synthesis Example 3

Synthesis of a Liquid Crystal Oligomer End-Capped with Hydroxyl Groups

A 24.9 g (0.15 mol) quantity of isophthalic acid, 2.0 g (0.01 mol) of 2-hydroxyl-6-naphthoic acid, 12.2 g (0.11 mol) of para-phenylenediamine, 12.3 g (0.11 mol) of 4-aminophenol and 51.7 g (0.51 mol) of acetic anhydride are introduced into a 500 ml three-neck flask equipped with a condenser and a mechanical stirrer. The mixture is slowly heated to 140° C. under a nitrogen atmosphere and allowed to react (by acetylation) for 3 hr while maintaining a constant temperature. After the subsequent addition of 28.2 g (0.15 mol) of 2-hydroxy-6-naphthoic acid, the mixture is heated to 270° C. while removing acetic acid (a by-product) and unreacted acetic anhydride. The reaction is continued for 30 min, yielding a liquid crystal amide-ester oligomer having hydroxyl groups. The liquid crystal oligomer may have the structure of Formula 13b.

Synthesis Example 4

Synthesis of Liquid Crystal Oligomer End-Capped with Hydroxyl Groups

A 24.9 g (0.15 mol) quantity of isophthalic acid, 32.7 g (0.30 mol) of 4-aminophenol and 67.4 g (0.66 mol) of acetic anhydride are introduced into a 500 ml three-neck flask equipped with a condenser and a mechanical stirrer. The mixture is slowly heated to 140° C. under a nitrogen atmosphere and allowed to react (by acetylation) for 3 hr while maintaining a constant temperature. After the subsequent addition of 56.5 g (0.30 mol) of 2-hydroxy-6-naphthoic acid, the mixture is heated to 270° C. while removing acetic acid (a by-product) and unreacted acetic anhydride. The reaction is continued for 30 min, yielding a liquid crystal amide-ester oligomer having hydroxyl groups. The liquid crystal oligomer may have the structure of Formula 13c.

Synthesis Example 5

Synthesis of a Liquid Crystal Oligomer End-Capped with Hydroxyl Groups

A 24.9 g (0.15 mol) quantity of isophthalic acid, 55.9 g (0.30 mol) of biphenol and 67.4 g (0.66 mol) of acetic anhydride are introduced into a 500 ml three-neck flask equipped with a condenser and a mechanical stirrer. The mixture is slowly heated to 140° C. under a nitrogen atmosphere and allowed to react (by acetylation) for 3 hr while maintaining a constant reaction temperature. After the subsequent addition of 56.5 g (0.30 mol) of 2-hydroxy-6-naphthoic acid, the mixture is heated to 270° C. while removing acetic acid as (by-product) and unreacted acetic anhydride. The reaction is continued for 30 min, yielding a soluble liquid crystal amide-ester oligomer having hydroxyl groups. The liquid crystal oligomer may have the structure of Formula 13e.

Synthesis Example 6

Synthesis of a Bismaleimide Compound

A 6.0 g quantity of 4,4'-dihydroxydiphenylmethane is dissolved in a solution of 12.6 ml of triethylamine in 50 ml of 1,2-dichloroethane in a 250 ml flask. To the solution is slowly added a solution of 15.5 g of methyl maleimidobenzoyl chloride in 50 ml of 1,2-dichloroethane. The mixture is allowed to react at room temperature for 16 hr. The reaction mixture is precipitated in water, filtered under reduced pressure, washed sequentially with water and ethanol, and dried at 60° C. under vacuum for 48 hr, yielding the bismaleimide compound of Formula 20m.

Synthesis Example 7

Synthesis of a Bismaleimide Compound

A 14.6 g quantity of 1,3'-bis(4-aminophenoxy)benzene is dissolved in 80 ml of acetone at room temperature, and then the solution is slowly added to a solution of 10.8 g of acetic anhydride in 20 ml of acetone with stirring. As the reaction proceeds, a yellow amic acid is obtained. After the reaction mixture is stirred at room temperature for 1 hr, 20 ml of acetic anhydride, 1.6 g of sodium acetate and 3 ml of triethylamine are added. The resulting solution is heated to 60° C. until it turns transparent. Stirring is continued for 2 hr to yield the bismaleimide compound of Formula 20d as a yellow solid.

Synthesis Example 8

Synthesis of a Bismaleimide Compound

The bismaleimide compound of Formula 20e is synthesized in the same manner as in Synthesis Example 3, except that 12.3 g of 2,2-bis[4-aminophenoxy)phenyl]propane is used instead of 4,4'-dihydroxydiphenylmethane.

Example 1

1-1

Preparation of a Composition

A 2.5 g quantity of the liquid crystal oligomer end-capped with hydroxyl groups, which is prepared in Synthesis Example 1, and 2.5 g of the bismaleimide compound of Formula 20c (BMI1000, Daiwa Kasei Industry Co.) are dissolved in 5 g of N-methyl-2-pyrrolidone ("NMP") to form a solution.

1-2

Production of a Prepreg

The solution is impregnated into a glass fiber having a thickness of 0.05 mm and a size of 4×4 cm² to form a specimen. The specimen is placed on an electrodeposited copper foil and cured in an electric furnace for 1 hr while raising the temperature of the furnace from room temperature to 300° C. to form a cured specimen comprising a polymer derived from the composition. The cured specimen is treated with 50 parts by weight of nitric acid solution to remove the copper foil, leaving a prepreg. The polymer is contained in the prepeg in an amount of 56 wt %, based on the total weight of the prepreg.

The coefficient of thermal expansion ("CTE") of the prepreg is measured using a thermomechanical analyzer (TMA 2940, TA Instruments) and is shown in Table 1. FIG. 1 is a thermomechanical analysis curve corresponding to the cured prepreg. The prepreg is observed to have a CTE of 9.7 parts per million per degree centigrade (ppm/° C.) in the temperature range between 50 and 150° C.

Example 2

A prepreg is produced in the same manner as in Example 1, except that 2.5 g of the bismaleimide compound (Formula 20m) prepared in Synthesis Example 6 is used instead of the bismaleimide compound of Formula 20c.

The CTE of the prepreg is measured using a thermomechanical analyzer (TMA 2940, TA Instruments) in the temperature range between 50 and 150° C. and is shown in Table 1. The prepreg is observed to have a CTE of 15.9 ppm/° C. in the temperature range between 50 and 150° C.

Example 3

A prepreg is produced in the same manner as in Example 1, except that 2.5 g of the bismaleimide compound (Formula 20d) prepared in Synthesis Example 7 is used instead of the bismaleimide compound of Formula 20c.

The CTE of the prepreg is measured using a thermomechanical analyzer (TMA 2940, TA Instruments) in the temperature range between 50 and 150° C. and is shown in Table 1. The prepreg is observed to have a CTE of 9.9 ppm/° C. in the temperature range between 50 and 150° C.

Example 4

A prepreg is produced in the same manner as in Example 1, except that 2.5 g of the bismaleimide compound (Formula 20e) prepared in Synthesis Example 8 is used instead of the bismaleimide compound of Formula 20c.

The CTE of the prepreg is measured using a thermomechanical analyzer (TMA 2940, TA Instruments) in the temperature range between 50 and 150° C. and is shown in Table 1. The prepreg is observed to have a CTE of 15.2 ppm/° C. in the temperature range between 50 and 150° C.

TABLE 1

| Example No. | Amount of polymer impregnated (wt %) | Blending ratio of liquid crystal oligomer to bismaleimide cross-linking agent | CTE (PPM/° C.) |
|---|---|---|---|
| Example 1 | 56 | 5:5 | 9.7 |
| Example 2 | 56 | 5:5 | 15.9 |
| Example 3 | 50 | 5:5 | 9.9 |
| Example 4 | 50 | 5:5 | 15.2 |

Evaluation of Physical Properties

In each of the prepregs produced in Examples 1-4, the amount (wt %) of the polymer (i.e. polymer derived from the liquid crystal polymer or oligomer and the cross-linking agent) impregnated is the sum of the amount of the polymer penetrating and attached to the reinforcing material and the amount of the polymer on the surface of the reinforcing material, based on the total weight amount of the prepreg. The polymer on the surface of the reinforcing material includes the polymer layered on the surface of the reinforcing material.

Example 5

A 2.8 g quantity of the liquid crystal oligomer end-capped with hydroxyl groups, which is prepared in Synthesis Example 1, and 1.2 g of the epoxy compound of Formula 28 are dissolved in 7 g of NMP, and then 0.012 g (0.01% relative to the total amount of the solutes) of the catalyst of Formula 29 is added thereto to form a mixture. The mixture is homogenized with sufficient stirring to form a solution. A prepreg is produced using the solution by the same method described in Example 1-2.

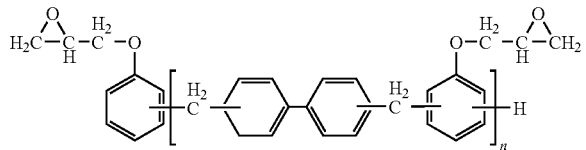

(28)

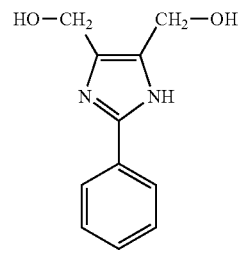

(29)

The CTE of the prepreg is measured using a thermomechanical analyzer (TMA 2940, TA Instruments) in the temperature range between 50 and 150° C. The prepreg is observed to have a CTE of 22.6 ppm/° C. in the temperature range between 50 and 150° C. The TMA results show that a specimen of the prepreg having an impregnation rate of 61 wt % has a CTE of 22.6 ppm/° C. in the temperature range between 50 and 150° C.

Example 6

A 2.8 g quantity of the liquid crystal oligomer end-capped with hydroxyl groups, which is prepared in Synthesis Example 1, and 1.2 g of the epoxy compound of Formula 30 are dissolved in 7 g of NMP, and 0.012 g (0.01% relative to the total amount of the solutes) of the catalyst of Formula 29 is added thereto to form a mixture. The mixture is homogenized with sufficient stirring to form a solution. A prepreg is produced using the solution by the same method described in Example 1-2.

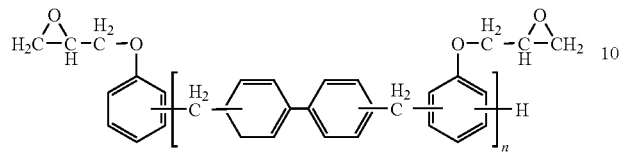

(30)

Example 7

A 2.4 g quantity of the liquid crystal oligomer end-capped with hydroxyl groups, which is prepared in Synthesis Example 1, 0.8 g of the bismaleimide compound (BMI-1000) of Formula 20c and 0.8 g of the epoxy compound of Formula 28 are dissolved in 7 g of NMP, and 0.012 g (0.01% relative to the total amount of the solutes) of the catalyst of Formula 29 is added thereto to form a mixture. The mixture is homogenized with sufficient stirring to form a solution. A prepreg is produced using the solution by the same method described in Example 1-2.

A 180° peel test is conducted on the prepreg using a universal tensile machine ("UTM"). The prepreg is measured to have a peel strength of 1.3 kN/m. The CTE of the prepreg is measured using a thermomechanical analyzer (TMA 2940, TA Instruments) in the temperature range between 50 and 150° C. The TMA results show that a specimen of the prepreg having an impregnation rate of 57 wt % has a CTE of 21.3 ppm/° C. in the temperature range between 50 and 150° C.

Example 8

A 1.2 g quantity of the liquid crystal oligomer end-capped with hydroxyl groups, which is prepared in Synthesis Example 1, and 1.2 g of a liquid crystalline oligomer compound of Formula 31 are added to 6 g of NMP. Subsequently, 0.8 g of the bismaleimide compound (BMI-1000) of Formula 20c and 0.8 g of the epoxy compound of Formula 28 are added to form a mixture. The mixture is dissolved, and then 0.012 g (0.01% relative to the total amount of the solutes) of the catalyst of Formula 29 is added thereto. The resulting mixture is homogenized with sufficient stirring to form a solution. A prepreg is produced using the solution by the same method described in Example 1-2.

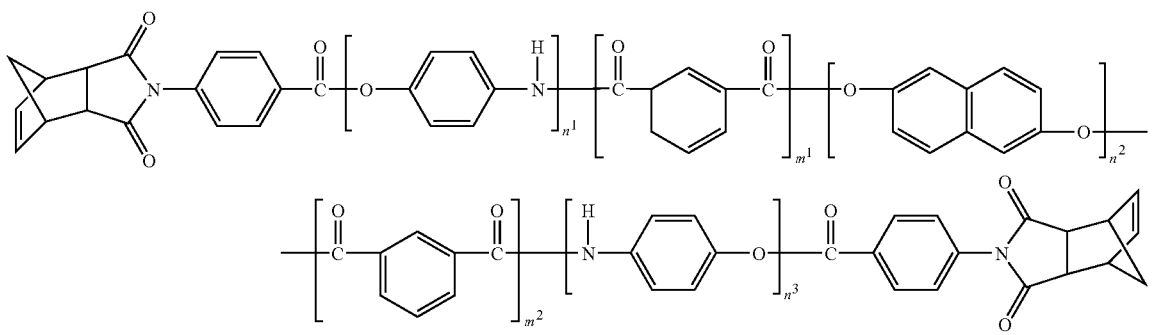

(31)

In Formula 31, $m^1$ and $m^2$ satisfy the relationship $1 \leq m^1 + m^2 \leq 50$ and $n^1$, $n^2$ and $n^3$ satisfy the relationship $1 \leq n^1 + n^2 n^3 \leq 50$.

A 180° peel test is conducted on the prepreg using a UTM. The prepreg is measured to have a peel strength of 1.4 kN/m. The CTE of the prepreg is measured using a thermomechanical analyzer (TMA 2940, TA Instruments) in the temperature range between 50 and 150° C. The TMA results show that a specimen of the prepreg having an impregnation rate of 50 wt % has a CTE of 14.5 ppm/° C. in the temperature range between 50 and 150° C.

As is apparent from the above description, the exemplary embodiments of the composition show excellent impregnation properties and thermal properties. Therefore, the exemplary embodiments may be advantageously used as materials for next-generation boards, which are lighter in weight and smaller in thickness and size.

Although exemplary embodiments have been described herein with reference to the foregoing embodiments, those skilled in the art will appreciate that various modifications and changes are possible without departing from the spirit of the invention as disclosed in the accompanying claims. Therefore, it is to be understood that such modifications and changes are encompassed within the scope of the invention.

What is claimed is:
1. A composition, comprising:
   a liquid crystal polymer or oligomer having a terminal hydroxyl group; and
   a cross-linking agent comprising a bismaleimide compound, an epoxy resin or a combination thereof,- wherein the liquid crystal polymer or oligomer is represented by Formula 1:

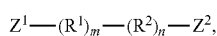
(1)

wherein $R^1$ is represented by Formula 2:

(2)

wherein $X^1$ and $Y^1$ are each independently selected from the group consisting of O, CO and NR", in which R" is independently selected from the group consisting of a hydrogen atom, a substituted or unsubstituted $C_1$-$C_{20}$ alkyl group, and a substituted or unsubstituted $C_6$-$C_{30}$ aryl group and $Ar^1$ comprises at least one divalent aromatic or alicyclic organic group selected from the group consisting of Formula 3:

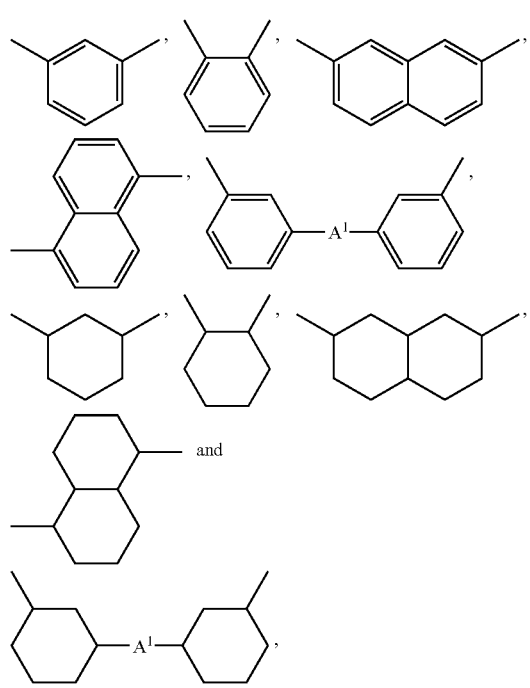
(3)

wherein at least one of the carbon atoms present in each of the aromatic and aliphatic rings is optionally replaced with a heteroatom independently selected from the group consisting of N, O, S and P, and each $A^1$ represents a single bond or is O, S, CO, SO, $SO_2$ or a divalent aliphatic or aromatic organic group, $R^2$ is represented by Formula 6:

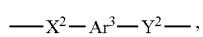
(6)

wherein $X^2$ and $Y^2$ are each independently selected from the group consisting of O, CO and NR", and $Ar^3$ comprises at least one divalent aromatic or alicyclic organic group selected from the group consisting of Formula 7:

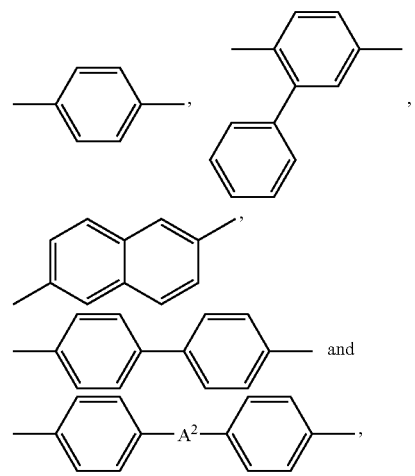
(7)

wherein $A^2$ is $N_2$, O, S, CO, SO, $SO_2$ or a divalent aliphatic or aromatic organic group, $Z^1$ and $Z^2$ are the same or different and are each independently an organic group comprising a hydroxyl, amine, carboxylic acid, acetyl or thiol group, with the proviso that at least one of $Z^1$ and $Z^2$ has a hydroxyl group, and m and n are each independently an integer from about 1 to about 100.

2. The composition of claim 1, wherein $R^1$ is a divalent aromatic or alicyclic radical having two linking groups, which are in an ortho or a meta position relative to each other.

3. The composition of claim 1, wherein the divalent aliphatic or aromatic organic group of Formula 3 is selected from the group consisting of a substituted or unsubstituted $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, a substituted or unsubstituted $C_4$-$C_{30}$ oxyheteroarylene group a linking group represented by Formula 3a:

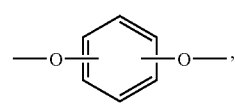
(3a)

wherein at least one of the CH moieties present in the aromatic ring is optionally replaced by a heteroatom independently selected from the group consisting of N, O, S and P, and a linking group represented by Formula 3b:

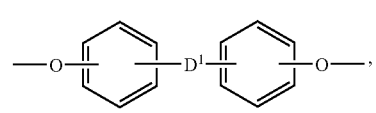
(3b)

wherein at least one of the CH moieties present in the aromatic rings is optionally replaced by a heteroatom independently selected from the group consisting of N, O, S and P, and $D^1$ is independently selected from the group consisting of O, S, CO, SO, $SO_2$ and a straight or branched $C_1$-$C_{20}$ alkylene group.

4. The composition of claim 1, wherein the divalent aromatic or aliphatic organic group of Formula 7 is selected from the group consisting of a substituted or unsubstituted $C_2$-$C_{20}$ alkylene groups, a substituted or unsubstituted $C_2$-$C_{20}$ alkenylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, a substituted or unsubstituted $C_4$-$C_{30}$ oxyheteroarylene group, and a group represented by Formula 8a:

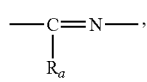
(8a)

wherein $R_a$ is a hydrogen atom, a halogen atom, a $C_1$-$C_5$ alkyl group or a $C_1$-$C_5$ haloalkyl group, and
a group represented by Formula 8b:

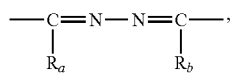
(8b)

wherein $R_a$ and $R_b$ are each independently a hydrogen atom, a halogen atom, a $C_1$-$C_5$ alkyl group or a $C_1$-$C_5$ haloalkyl group.

5. The composition of claim 1, wherein a quantity n/(n+m+2) is greater than about 0.05 and less or equal to about 0.6.

6. The composition of claim 1, wherein the liquid crystal polymer or oligomer having a terminal hydroxyl groups is selected from the group consisting of compounds represented by Formulas 11a, 11b, 11c and 11d:

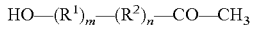
(11a), wherein $R^1$ is at least one divalent radical selected from the group consisting of Formula 4:

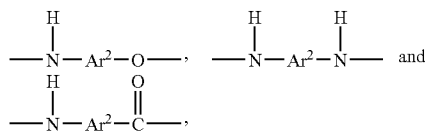
(4)

wherein each $Ar^2$ is independently selected from the group consisting of Formula 5:

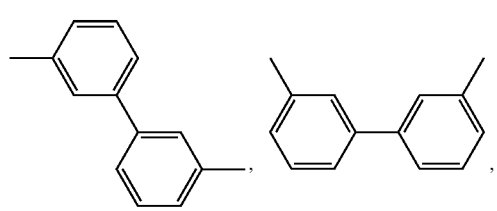
(5)

-continued

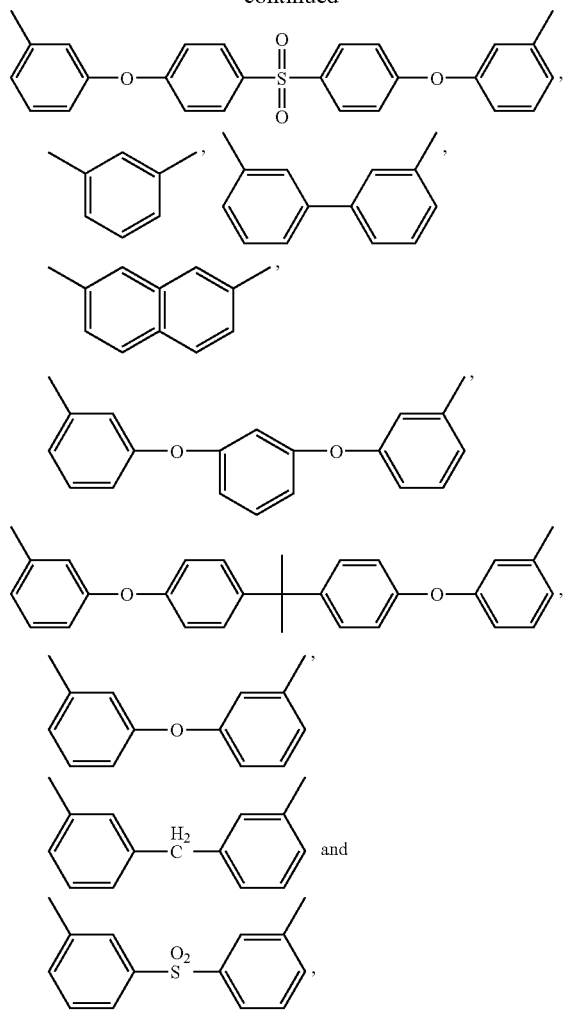

$R^2$ is at least one divalent radical selected from the group consisting of Formula 9:

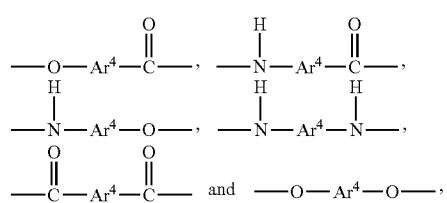
(9)

wherein each $Ar^4$ is independently selected from the group consisting of Formula 10:

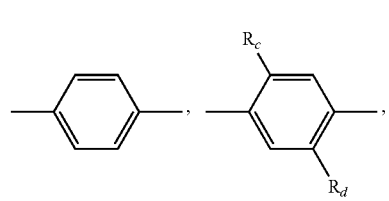
(10)

-continued

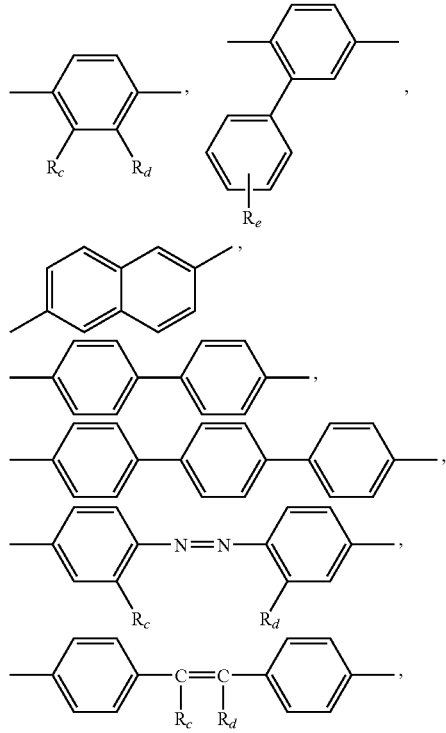

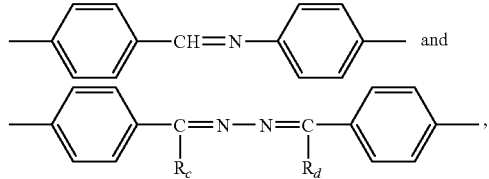

wherein $R_c$ and $R_d$ are each independently a proton, a $C_1$-$C_5$ alkyl group or a halogen group, and
m and n are each independently an integer from about 1 to about 100;

    (11b), wherein $R^2$, m and n are as defined in Formula 11a;

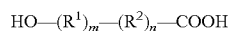    (11c), wherein $R^2$, m and n are as defined in Formula 11a; and

    (11d), wherein $R^2$, m and n are as defined in Formula 11a.

7. The composition of claim 1, wherein the liquid crystal polymer or oligomer having a terminal hydroxyl group is selected from the group consisting of compounds represented by Formulas 13a-13e, 14a-14e, 15a-15e, 16a-16e and 17a-17e:

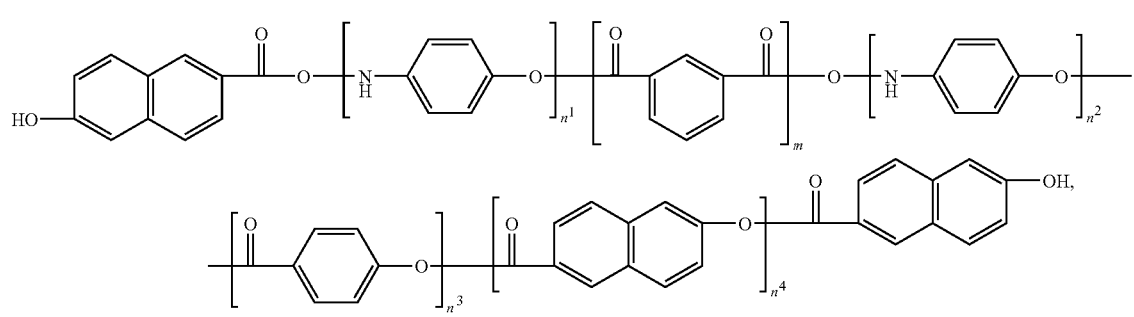

(13a)

wherein m, $n^1$, $n^2$, $n^3$ and $n^4$ are each independently an integer from about 1 to about 100 and $n^1$, $n^2$, $n^3$ and $n^4$ satisfy the relationship $1 \leq n^1+n^2+n^3+n^4 \leq 100$;

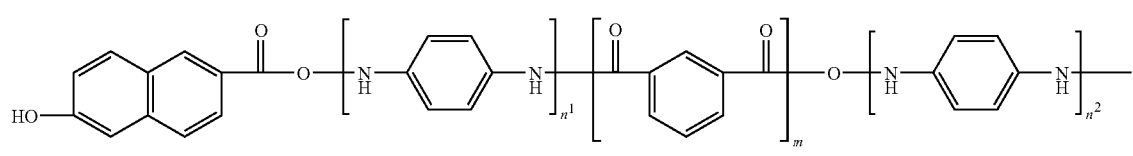

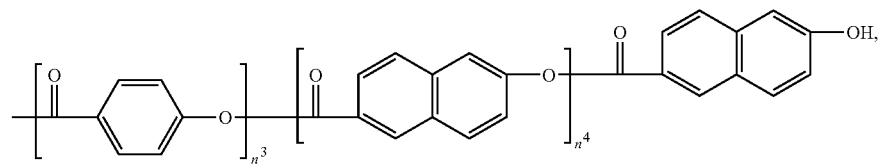

(13b)

wherein m, $n^1$, $n^2$, $n^3$ and $n^4$ are as defined in Formula 13a;

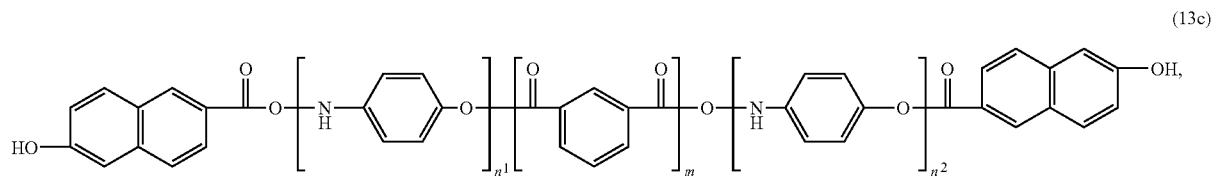
(13c)

wherein m, $n^1$ and $n^2$ are each independently an integer from about 1 to about 100 and $n^1$ and $n^2$ satisfy the relationship $1 \leq n^1 + n^2 \leq 100$;

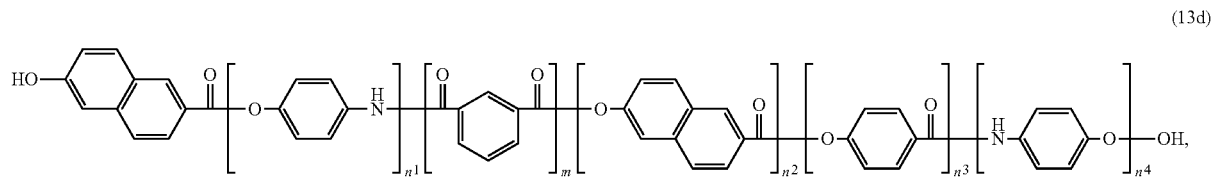
(13d)

wherein m, $n^1$, $n^2$, $n^3$ and $n^4$ are as defined in Formula 13a;

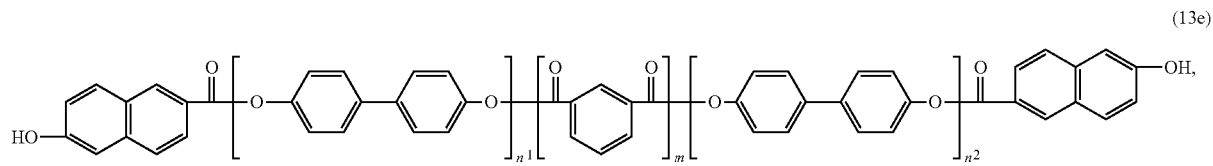
(13e)

wherein m, $n^1$ and $n^2$ are as defined in Formula 13c;

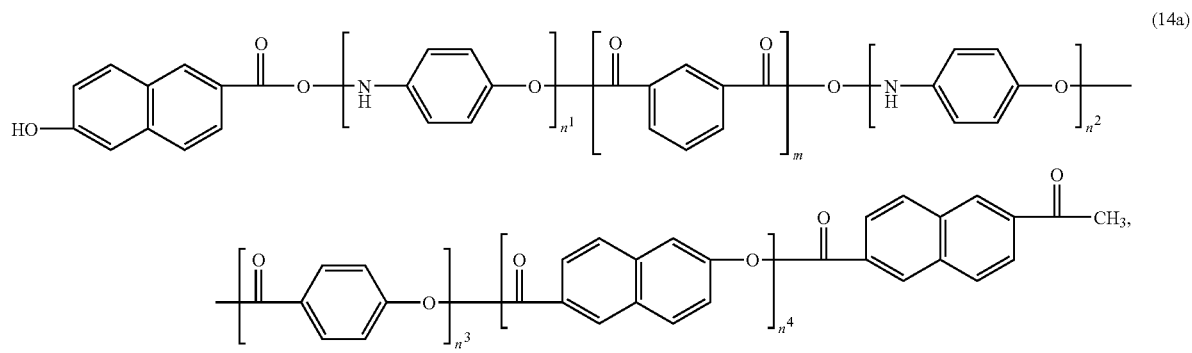
(14a)

wherein m, $n^1$, $n^2$, $n^3$ and $n^4$ are as defined in Formula 13a;

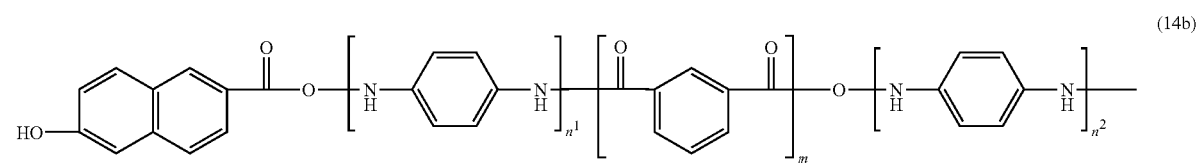
(14b)

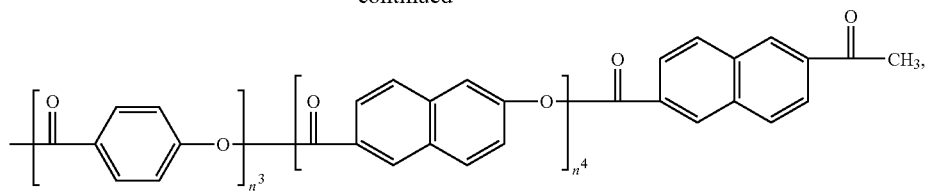
wherein m, $n^1$, $n^2$, $n^3$ and $n^4$ are as defined in Formula 13a;
(14c)
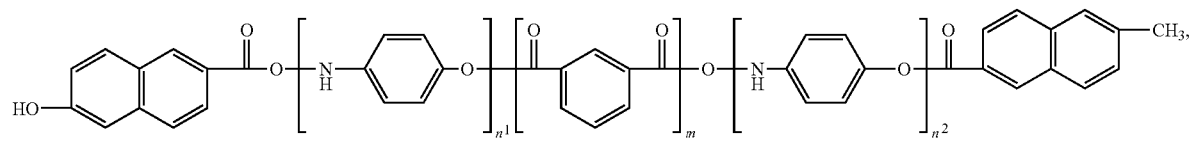
wherein m, $n^1$ and $n^2$ are as defined in Formula 13c;
(14d)
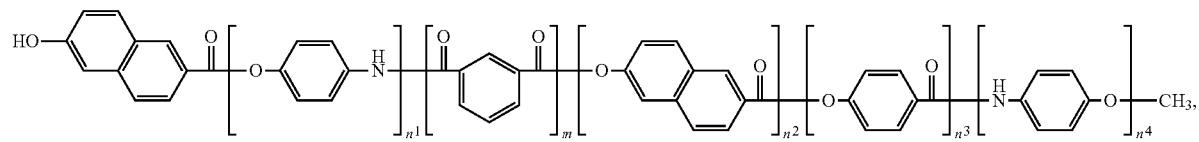
wherein m, $n^1$, $n^2$, $n^3$ and $n^4$ are as defined in Formula 13a;
(14e)
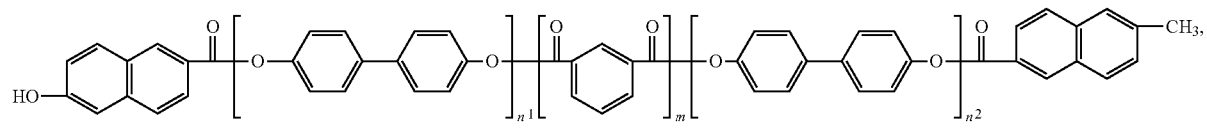
wherein m, $n^1$ and $n^2$ are as defined in Formula 13c;
(15a)
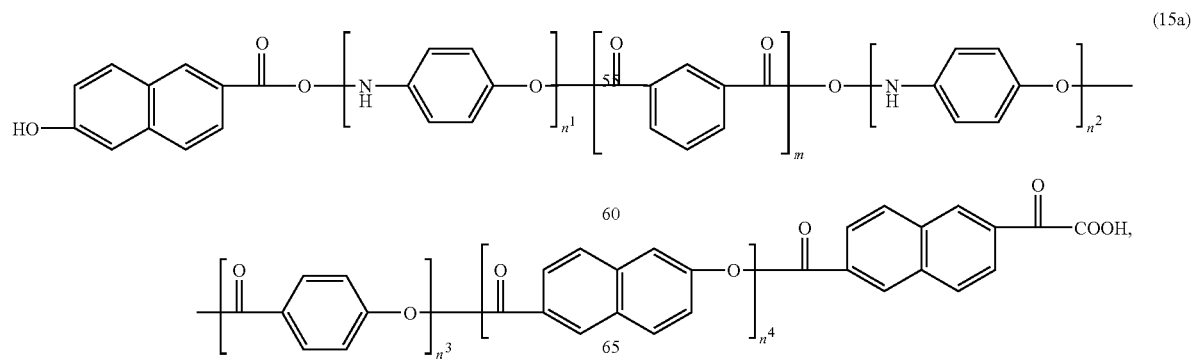

wherein m, $n^1$, $n^2$, $n^3$ and $n^4$ are as defined in Formula 13a;
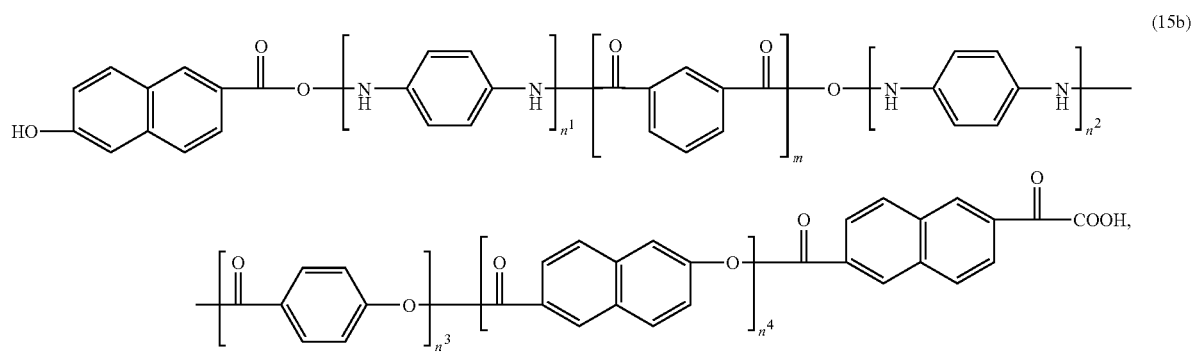
(15b)
wherein m, $n^1$, $n^2$, $n^3$ and $n^4$ are as defined in Formula 13a;
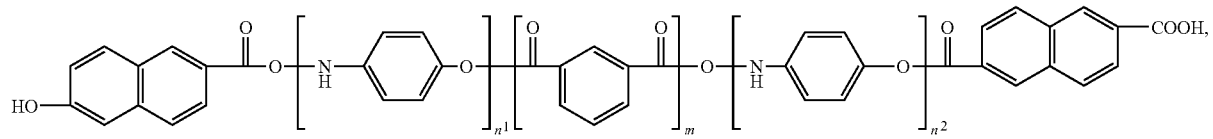
(15c)
wherein m, n1 and n2 are as defined in Formula 13c;
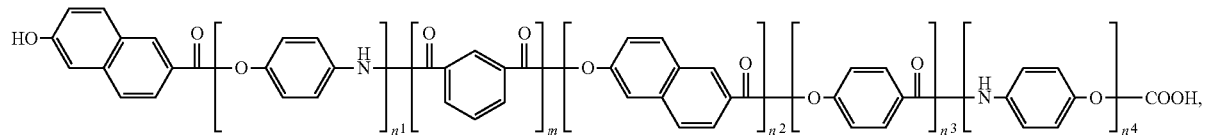
(15d)
wherein m, $n^1$, $n^2$, $n^3$ and $n^4$ are as defined in Formula 13a;
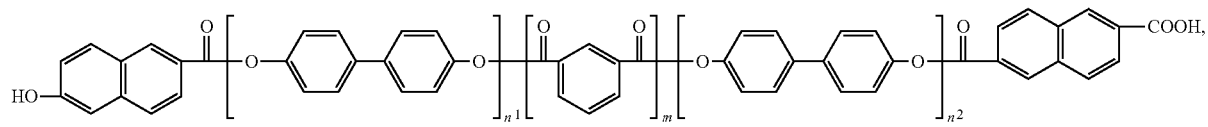
(15e)
wherein m, n1 and n2 are as defined in Formula 13c;
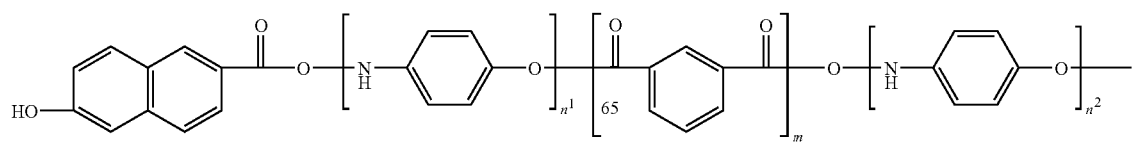
(16a)

-continued
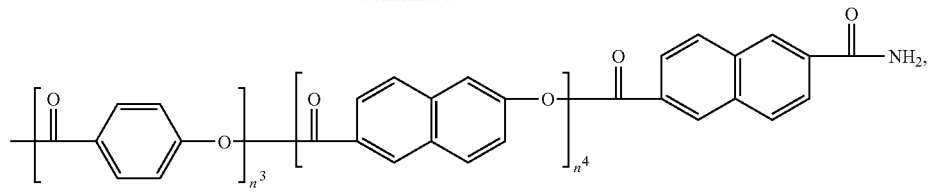
10
wherein m, $n^1$, $n^2$, $n^3$ and $n^4$ are as defined in Formula 13a;
(16b)
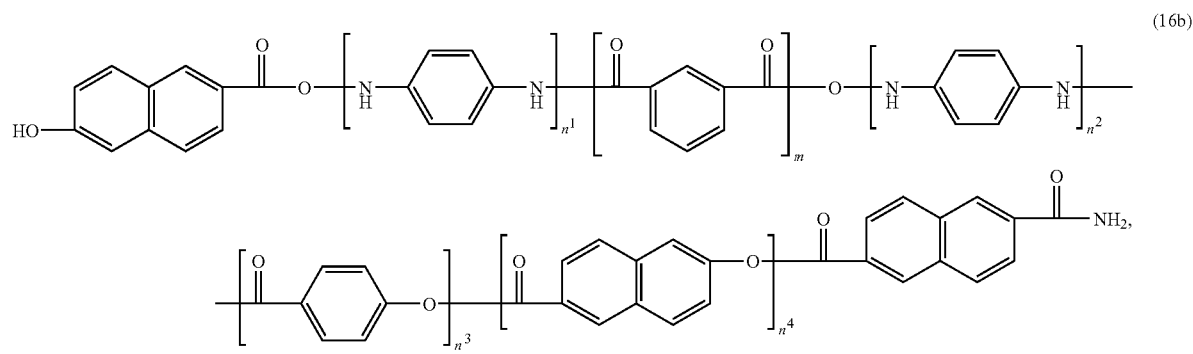
wherein m, $n^1$, $n^2$, $n^3$ and $n^4$ are as defined in Formula 13a;
(16c)
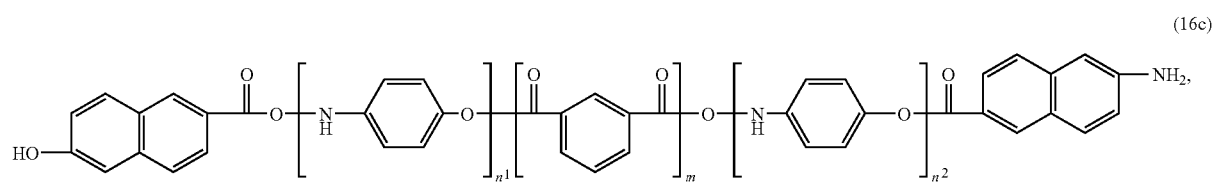
40
wherein m, $n^1$ and $n^2$ are as defined in Formula 13c;
(16d)
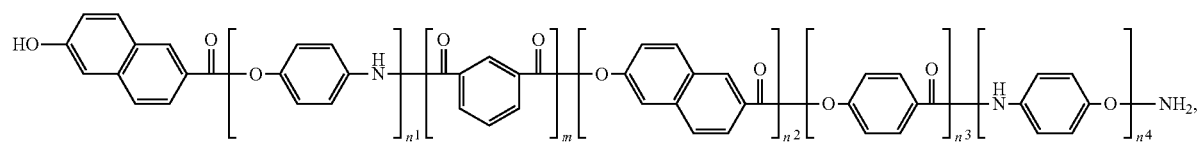
wherein m, n1, n2, n3 and n4 are as defined in Formula 13a;
(16e)
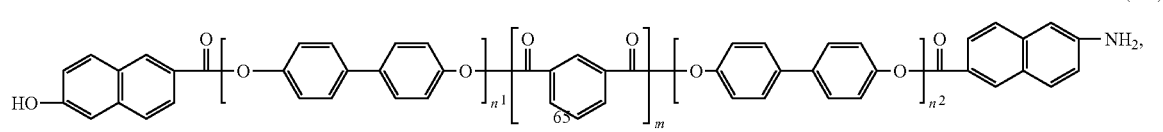

wherein m, $n^1$ and $n^2$ are as defined in Formula 13c;

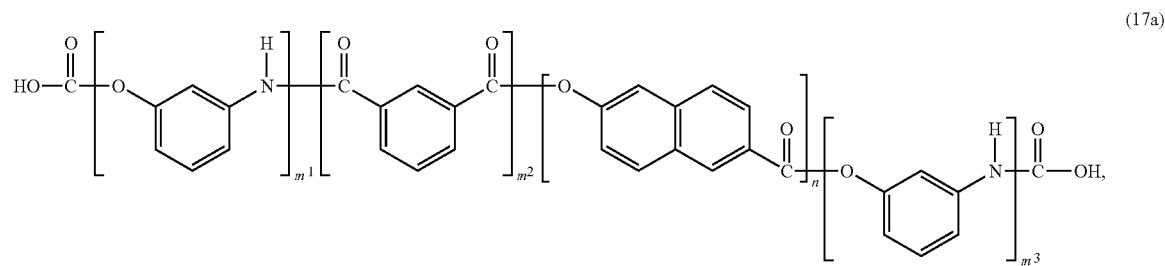

(17a)

wherein $m^1$, $m^2$, $m^3$ and n are each independently an integer from about 1 to about 100 and $m^1$, $m^2$ and $m^3$ satisfy the relationship $1 \leq m^1+m^2+m^3 \leq 100$;

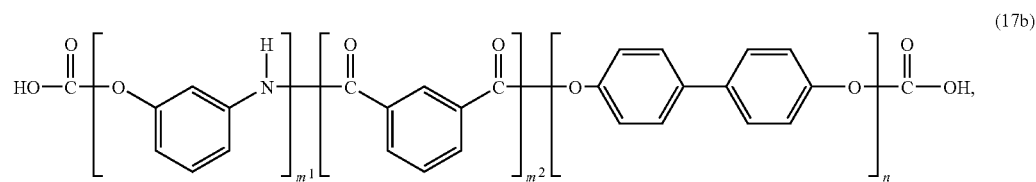

(17b)

wherein $m^1$, $m^2$ and n are each independently an integer from about 1 to about 100 and $m^1$ and $m^2$ satisfy the relationship $1 \leq m^1+m^2 \leq 100$;

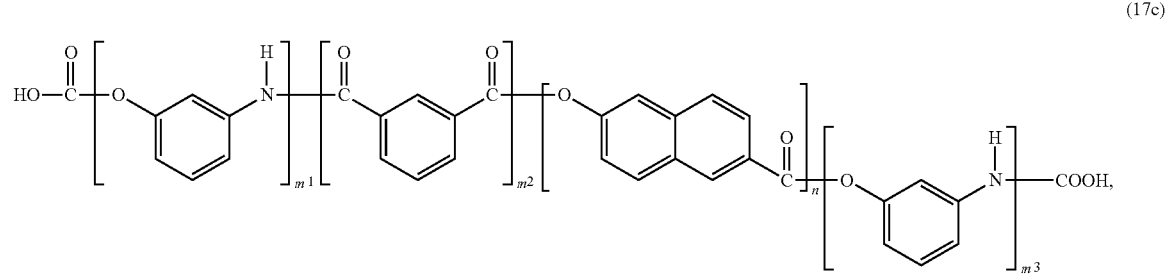

(17c)

wherein $m^1$, $m^2$, $m^3$ and n are as defined in Formula 17a;

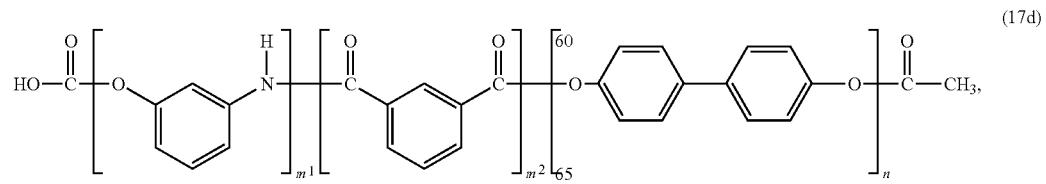

(17d)

wherein $m^1$, $m^2$ and n are as defined in Formula 17b; and

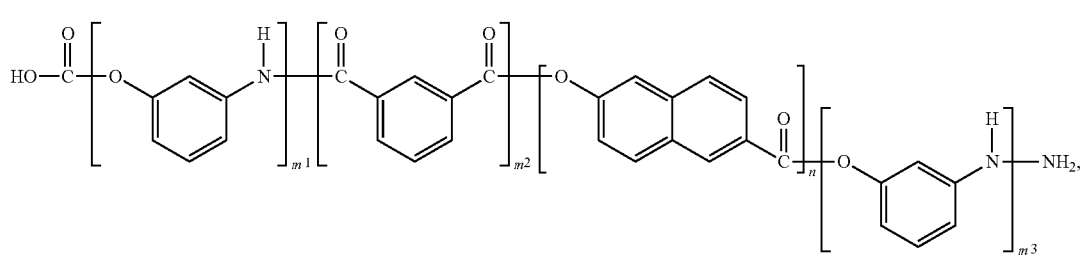

(17e)

wherein $m^1$, $m^2$, $m^3$ and n are as defined in Formula 17a.

8. The composition of claim 1, wherein the liquid crystal polymer or oligomer has a number average molecular weight of about 1,000 to about 100,000 Daltons.

9. The composition of claim 1, wherein the bismaleimide compound is a bismaleimide compound of Formula 18:

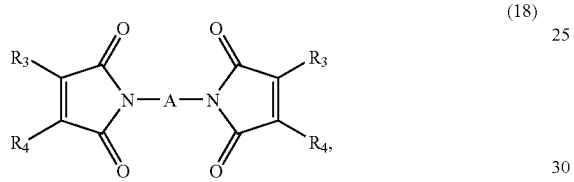

(18)

wherein $R_3$ and $R_4$ are each independently H or $CH_3$, and A is a divalent radical comprising a $C_2$-$C_{60}$ alkyl or aromatic group or is at least one divalent radical selected from the group consisting of units represented by Formula 18a:

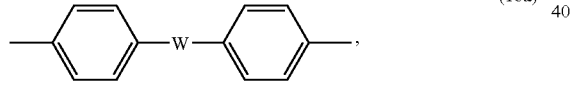

(18a)

wherein W is independently selected from the group consisting of O, S, CO, SO, $SO_2$, a straight or branched $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, a substituted or unsubstituted $C_4$-$C_{30}$ oxyheteroarylene groups, and a linking group represented by Formula 18b:

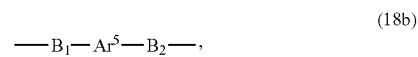

(18b)

wherein $B_1$ and $B_2$ are each independently selected from the group consisting of O, S, CO, SO, $SO_2$, CONH and COO, and $Ar^5$ is a divalent linking group selected from the group consisting of

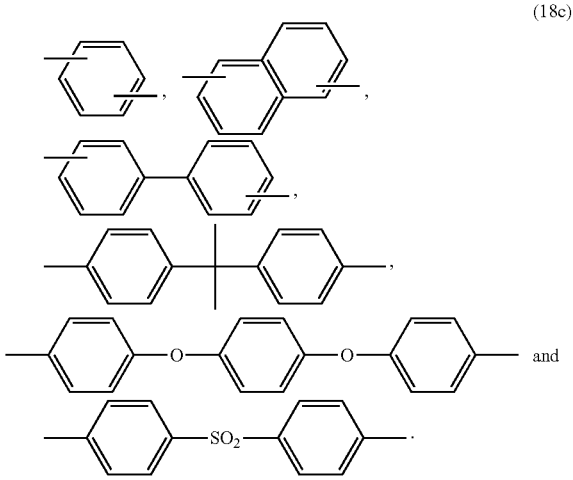

(18c)

10. The composition of claim 1, wherein the bismaleimide compound is selected from the group consisting of the compounds of Formulas 20a to 20r:

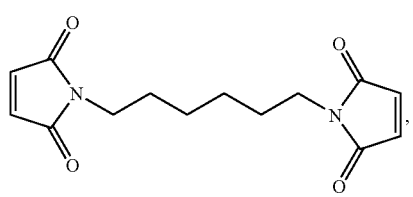

(20a)

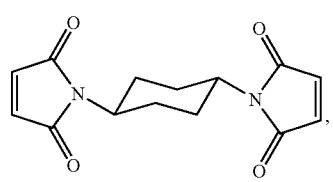

(20b)

-continued
(20c)
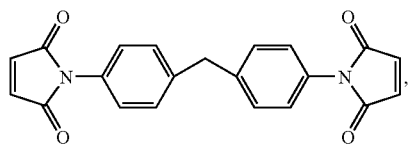
(20d)
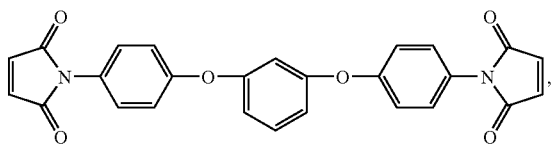
(20e)
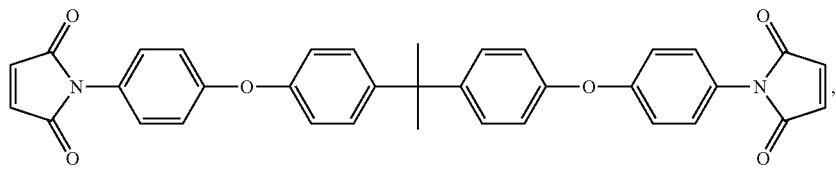
(20f)
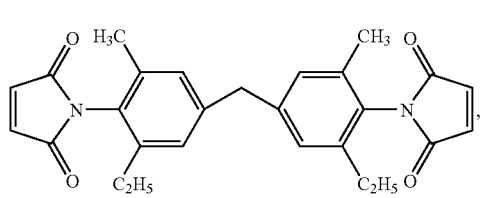
(20g)
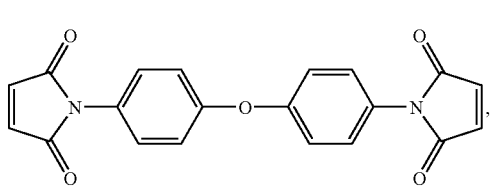
(20h)
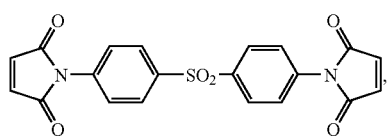
(20i)
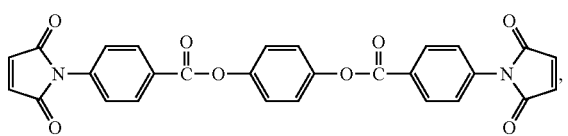
(20j)
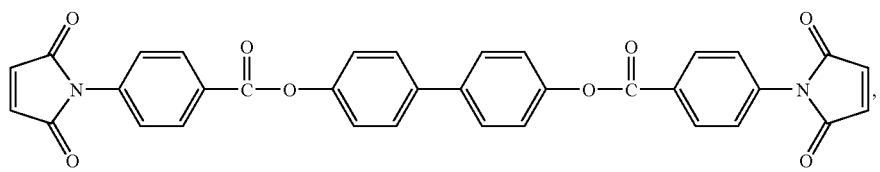
(20k)
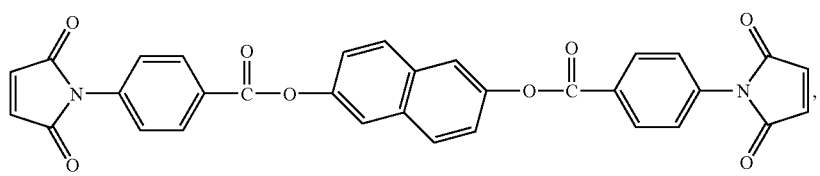
(20l)
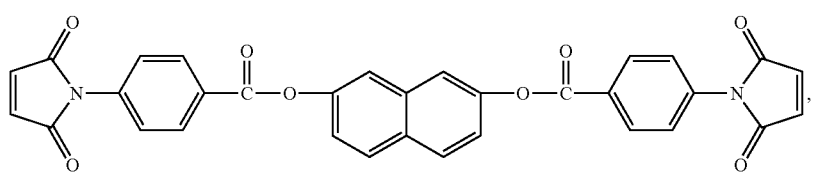
(20m)
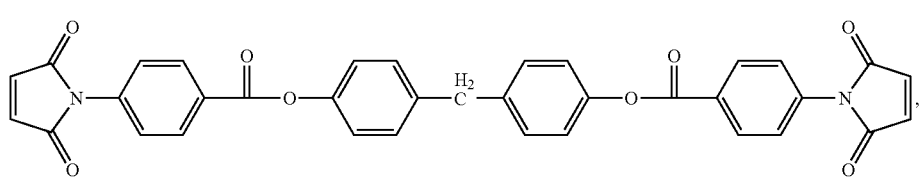

-continued

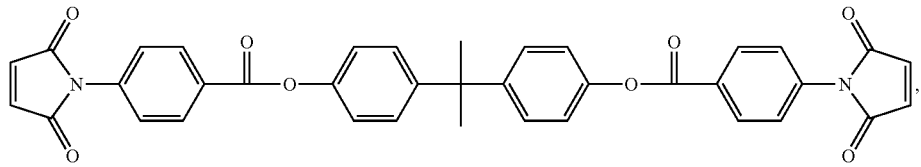
(20n)

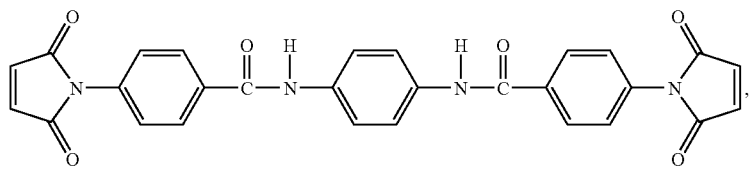
(20o)

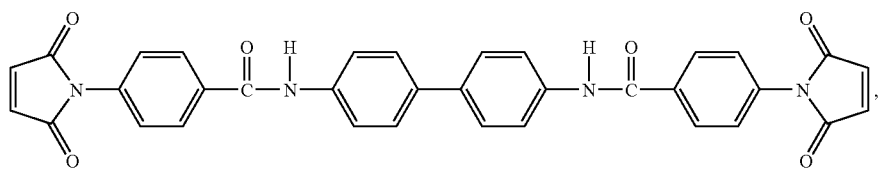
(20p)

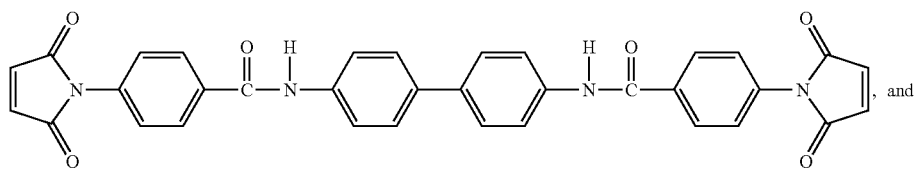
(20q)

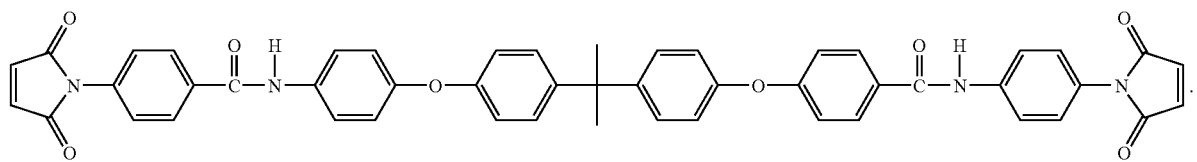
, and (20r)

11. The composition of claim 1, further comprising an organic solvent.

12. The composition of claim 11, wherein the composition comprises about 5 to about 95 parts by weight of the liquid crystal polymer or oligomer and about 5 to about 100 parts by weight of the cross-linking agent, based on 100 parts by weight of the organic solvent.

13. The composition of claim 1, further comprising a liquid crystalline thermoset oligomer represented by Formula 22:

(22)

wherein $R^5$ is represented by Formula 23:

(23)

wherein $X^3$ and $Y^3$ are each independently selected from the group consisting of O, CO and NR'', in which R'' is selected from the group consisting of a hydrogen atom, a substituted or unsubstituted $C_1$-$C_{20}$ alkyl group, and a substituted or unsubstituted $C_6$-$C_{30}$ aryl group, with the proviso that at least one of $X^3$ and $Y^3$ is NR'', and $Ar^5$ comprises at least one divalent aromatic or alicyclic organic group selected from the group consisting of Formula 24:

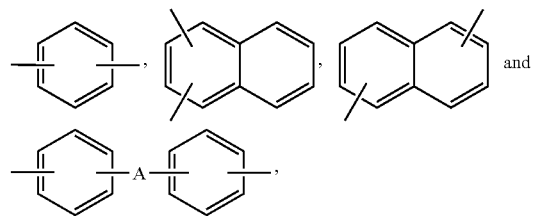
(24)

wherein $A^6$ represents a single bond or is selected from the group consisting of O, S, CO, SO, $SO_2$, a straight or branched $C_1$-$C_{20}$ alkyl group, a substituted or unsubstituted $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_6$-$C_{30}$ aryl group, with the unsubstituted $C_4$-$C_{30}$ heteroarylene group, a substituted or unsubstituted $C_4$-$C_{30}$ oxyheteroarylene group, a linking group represented by Formula 24a:

 (24a)

and a linking group represented by Formula 24b:

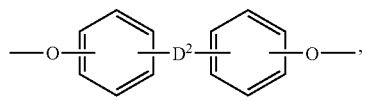 (24b)

wherein $D^2$ is $SO_2$ or a straight or branched $C_1$-$C_{20}$ alkyl group;

$R^6$ is represented by Formula 25:

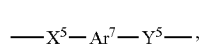 (25)

wherein $X^5$ and $Y^5$ are each independently O or CO, and $Ar^7$ comprises at least one divalent aromatic or alicyclic organic group selected from the group consisting of Formula 26:

(26)
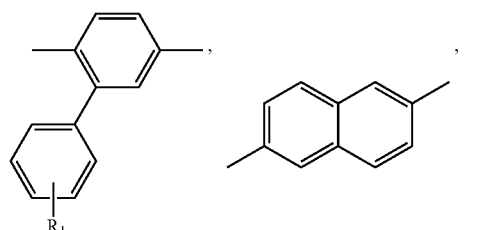
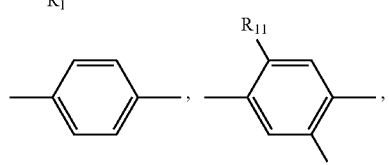
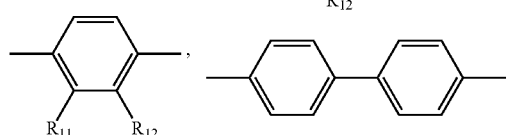
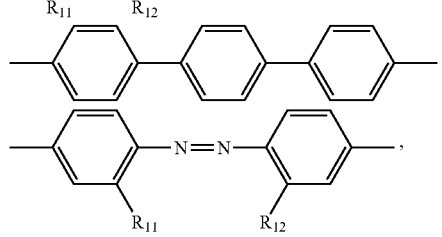

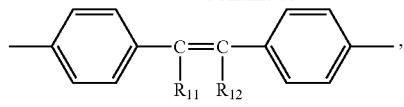
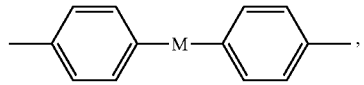
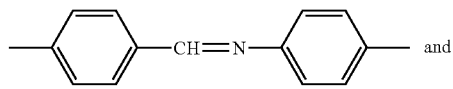 and
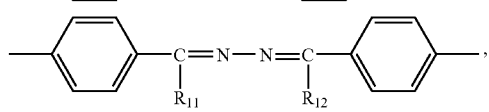

wherein $R_{11}$ and $R_{12}$ are each independently a proton, a $C_1$-$C_5$ alkyl group or a halogen group, and M is selected from the group consisting of O, S, CO, SO, $SO_2$, a straight or branched $C_1$-$C_{20}$ alkyl group, a substituted or unsubstituted $C_2$-$C_{20}$ alkylene group, a substituted or unsubstituted $C_2$-$C_{20}$ alkoxylene group, a substituted or unsubstituted $C_2$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_4$-$C_{30}$ heteroarylene group, and a substituted or unsubstituted $C_4$-$C_{30}$ oxyheteroarylene group;

$Z^5$ and $Z^6$ are each independently a thermally cross-linkable reactive group having at least one terminal multiple bond; and i and j are each independently an integer from about 1 to about 50.

14. The composition of claim 13, wherein the liquid crystalline thermoset oligomer has a number average molecular weight of about 500 to about 9,000 Daltons.

15. A resin cured product, comprising:

a polymer derived from a liquid crystal polymer or oligomer and a cross-linking agent comprising a bismaleimide compound, an epoxy resin or a combination thereof, wherein the liquid crystal polymer or oligomer is represented by Formula 1:

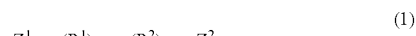 (1)

wherein $R^1$ is represented by Formula 2:

 (2)

wherein $X^1$ and $Y^1$ are each independently selected from the group consisting of O, CO and NR", in which R" is selected from the group consisting of a hydrogen atom, a substituted or unsubstituted $C_1$-$C_{20}$ alkyl group, and a substituted or unsubstituted $C_6$-$C_{30}$ aryl group, and $Ar^1$ comprises at least one divalent aromatic or alicyclic organic group selected from the group consisting of Formula 3:

(3)

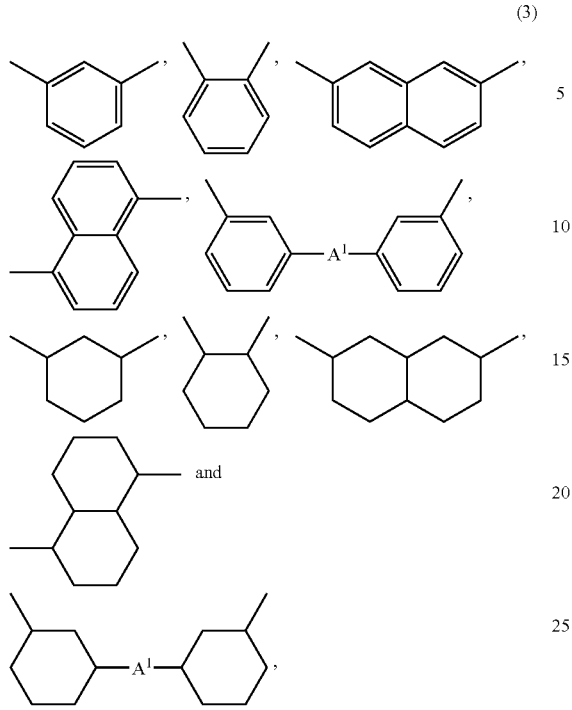

and wherein at least one of the carbon atoms present in each of the aromatic and aliphatic rings is optionally replaced with a heteroatom independently selected from the group consisting of N, O, S and P, and each $A^1$ represents a single bond or is O, S, CO, SO, $SO_2$ or a divalent aliphatic or aromatic organic group, $R^2$ is represented by Formula 6:

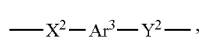

$$—X^2—Ar^3—Y^2—,$$ (6)

wherein $X^2$ and $Y^2$ are each independently selected from the group consisting of O, CO and NR", and $Ar^3$ comprises at least one divalent aromatic or alicyclic organic group selected from the group consisting of Formula 7:

(7)

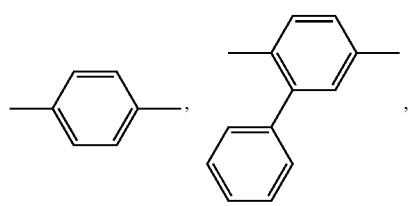

-continued

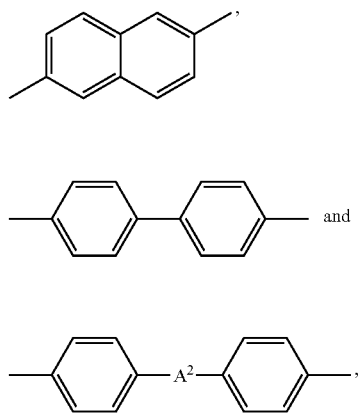

and wherein $A^2$ is $N_2$, O, S, CO, SO, $SO_2$ or a divalent aliphatic or aromatic organic group, $Z^1$ and $Z^2$ are the same or different and are each independently an organic group comprising a hydroxyl, amine, carboxylic acid, acetyl or thiol group, with the proviso that at least one of $Z^1$ and $Z^2$ has a hydroxyl group, and m and n are each independently an integer from about 1 to about 100.

16. A board, comprising:

the resin cured product of claim 15.

17. The board of claim 16, further comprising a reinforcing material wherein the resin cured product contacts the reinforcing material.

18. The board of claim 16, further comprising a metal foil contacting at least one side of the resin cured product.

19. The board of claim 18, wherein the resin cured product has a peel strength to the metal foil of equal to or greater than 0.8 kiloNewtons per meter.

20. The board of claim 18, wherein the metal foil is patterned on one or both sides thereof.

21. A storage medium, comprising:

the board of claim 16; and at least one memory chips electrically connected to the board.

22. A method for producing a prepreg, the method comprising:

impregnating the composition of claim 1 into a reinforcing material to form a coated reinforcing material;

drying the coated reinforcing material; and curing the coated reinforcing material.

* * * * *